United States Patent [19]

Shimoda et al.

[11] Patent Number: 5,289,190
[45] Date of Patent: Feb. 22, 1994

[54] RECORDING/REPRODUCING APPARATUS INCLUDING CONTROL SIGNAL INDICATING HIGH-EFFICIENCY CODING

[75] Inventors: Kenji Shimoda; Junko Kimura, both of Yokohama, Japan

[73] Assignee: Kabushiki Kaisha Toshiba, Kawasaki, Japan

[21] Appl. No.: 813,700

[22] Filed: Dec. 27, 1991

[30] Foreign Application Priority Data

Dec. 27, 1990 [JP] Japan .................................. 2-418760
Jun. 4, 1991 [JP] Japan .................................. 3-132993

[51] Int. Cl.⁵ ......................... H04N 1/41; H04N 5/76
[52] U.S. Cl. ...................................... 341/50; 369/84; 348/304; 348/441
[58] Field of Search ............... 341/50; 369/84; 360/15, 360/32; 358/140, 133

[56] References Cited

U.S. PATENT DOCUMENTS

| | | | |
|---|---|---|---|
| 4,974,078 | 11/1990 | Tsai | 358/133 |
| 4,982,282 | 1/1991 | Saito et al. | 358/133 |
| 5,128,757 | 7/1992 | Citta et al. | 358/133 |
| 5,142,380 | 8/1992 | Sakagami et al. | 358/432 |
| 5,193,010 | 3/1993 | Juri et al. | 358/336 |

FOREIGN PATENT DOCUMENTS

0401854  12/1990  European Pat. Off. .

OTHER PUBLICATIONS

Patent Abstracts of Japan, vol. 15, No. 148 (E-1056) Apr. 15, 1991, JP-A-30 24 886, Feb. 1, 1991.
EBU Review-Technical, No. 230, Aug. 1988, pp. 158-181, "Low Bit-Rate Coding of High-Quality Audio Signals", G. Theile, et al.
Patent Abstracts of Japan, vol. 13, No. 435 (E-825) Sep. 28, 1989, JP-A-11 62 080 Jun. 26, 1989.

*Primary Examiner*—Marc S. Hoff
*Attorney, Agent, or Firm*—Oblon, Spivak, McClelland, Maier & Neustadt

[57] ABSTRACT

The present invention relates to a recording/reproducing apparatus which records an effective transmit information signal on a recording medium in a high-efficiency coded form and decodes the high-efficiency coded signal read from the recording medium to recover the original information signal. At the time of recording or dubbing of the recovered information signal on another recording medium, the information signal, a control signal indicating whether or not the information signal has been subjected to high-efficiency coding and decoding processes and a specific signal indicating a specific value used in the high-efficiency coding and decoding processes when the information signal has been subjected to the high-efficiency coding and decoding processes are transmitted, thereby preventing the deterioration of data due to the high-efficiency coding.

12 Claims, 21 Drawing Sheets

| 100 | 80 | 70 | 60 |
|---|---|---|---|
| 80 | 70 | 60 | 50 |
| 70 | 60 | 50 | 40 |
| 60 | 50 | 40 | 30 |

FIG. 3A
(PRIOR ART)

| 1 | 2 | 3 | 4 |
|---|---|---|---|
| 2 | 3 | 4 | 5 |
| 3 | 4 | 5 | 6 |
| 4 | 5 | 6 | 7 |

FIG. 3B
(PRIOR ART)

| 50 | 20 | 11 | 7 |
|---|---|---|---|
| 20 | 11 | 7 | 5 |
| 11 | 7 | 5 | 3 |
| 7 | 5 | 3 | 2 |

FIG. 3C
(PRIOR ART)

| 100 | 80 | x 66 | x 56 |
|---|---|---|---|
| 80 | x 66 | x 56 | 50 |
| x 66 | x 56 | 50 | x 36 |
| x 56 | 50 | x 36 | x 28 |

FIG. 3D
(PRIOR ART)

| 55 | 22 | 12 | 7 |
|----|----|----|---|
| 22 | 12 | 7  | 5 |
| 12 | 7  | 5  | 3 |
| 7  | 5  | 3  | 2 |

FIG. 4A
(PRIOR ART)

| 99.0 | 79.2 | 64.8 | 50.4 |
|------|------|------|------|
| 79.2 | 64.8 | 50.4 | 45.0 |
| 64.8 | 50.4 | 45.0 | 32.4 |
| 50.4 | 45.0 | 32.4 | 27.2 |

FIG. 4B
(PRIOR ART)

| 50 | 20 | 11 | 7 |
|----|----|----|---|
| 20 | 11 | 7  | 5 |
| 11 | 7  | 5  | 3 |
| 7  | 5  | 3  | 2 |

FIG. 5A

| 100 | 80 | 66 | 56 |
|-----|----|----|----|
| 80  | 66 | 56 | 50 |
| 66  | 56 | 50 | 36 |
| 56  | 50 | 36 | 28 |

FIG. 5B

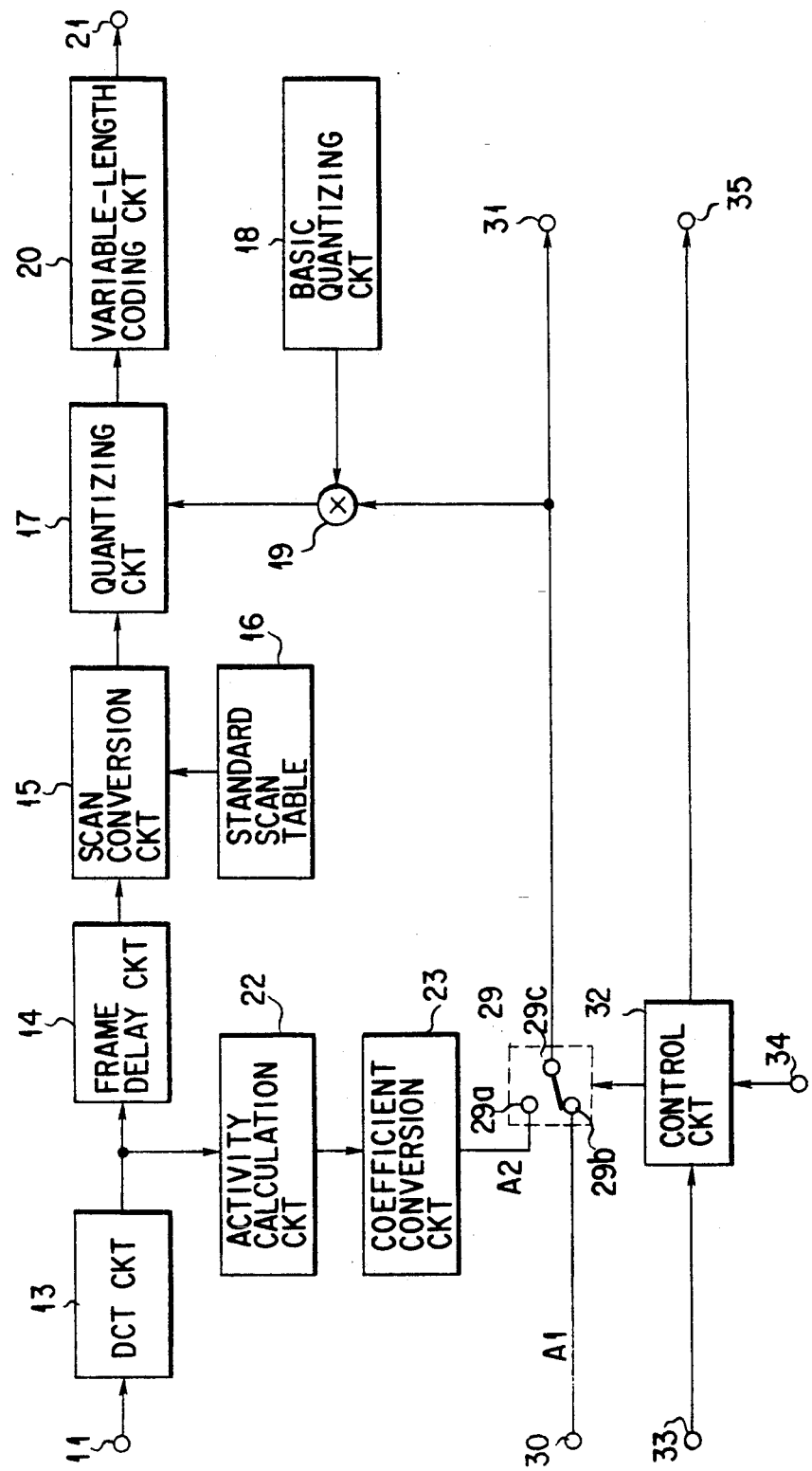
F I G. 8

| | | | BLOCK 1 | BLOCK 2 | BLOCK 3 | TOTAL |
|---|---|---|---|---|---|---|
| FIRST CODING | DEFINITION | A0 | 280 | 350 | 570 | 1200 |
| FIRST CODING | ALLOCATED AMOUNT OF CODING | L0 | 23.3 | 29.17 | 47.5 | 100 |
| FIRST CODING | ACTUAL AMOUNT OF CODING | L'0 | 22 | 29 | 45 | 98 |
| NEXT CODING | DEFINITION | A1 | 250 | 348 | 540 | 1138 |
| NEXT CODING | ALLOCATED AMOUNT OF CODING | L1 | 21.96 | 30.5 | 47.54 | 100 |
| NEXT CODING | ACTUAL AMOUNT OF CODING | L'1 | 18 | 29 | 45 | 92 |
F I G. 10
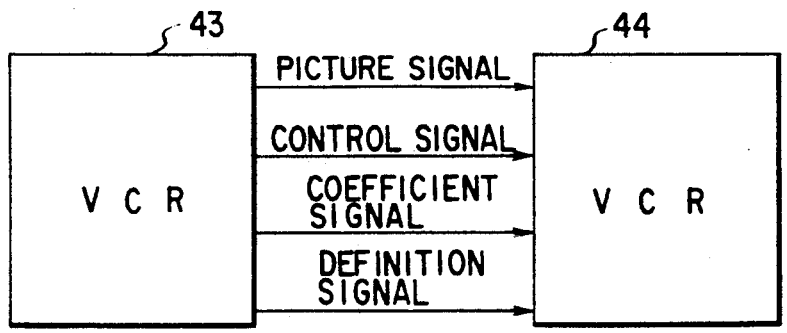
F I G. 11

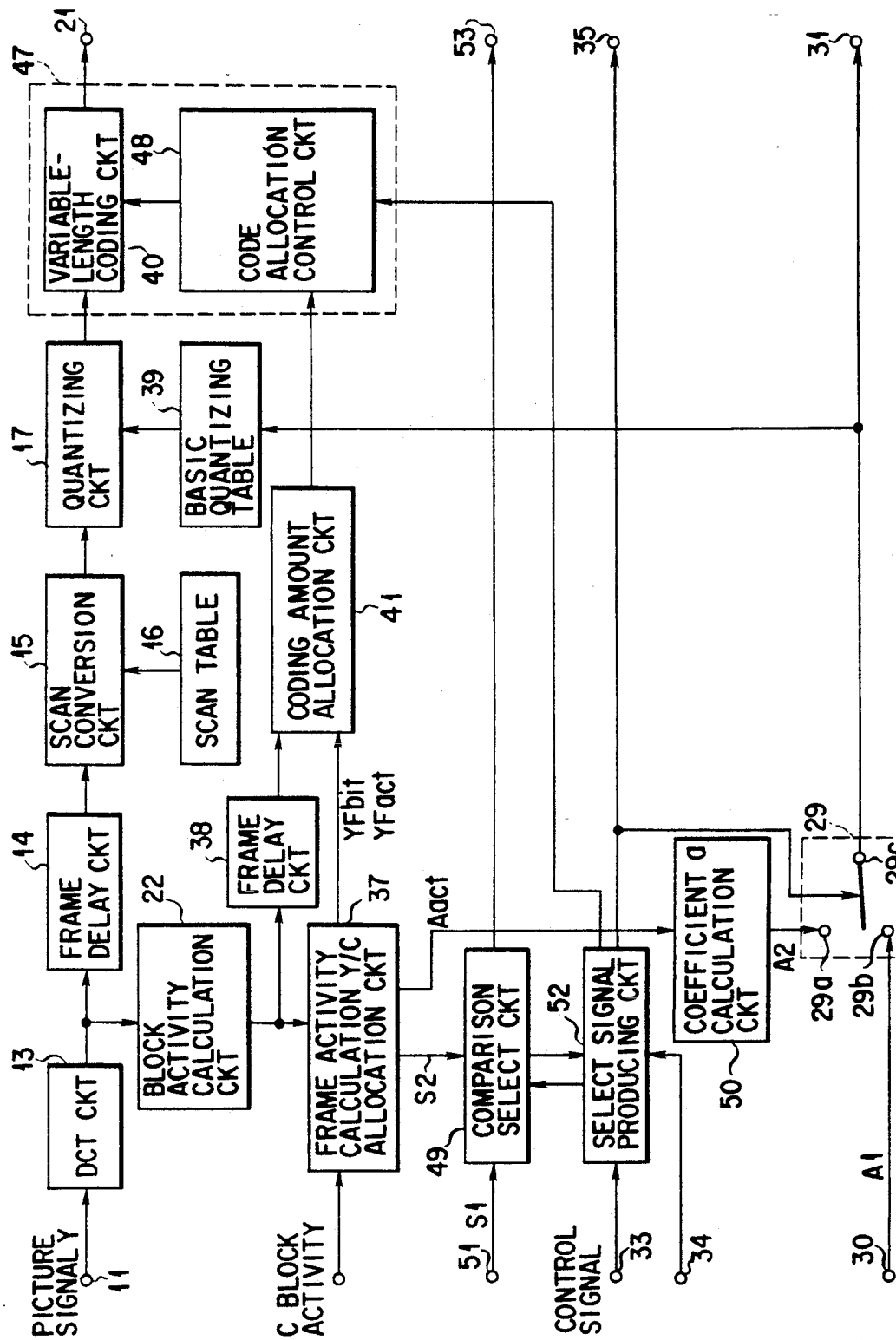
F I G. 13

| S1, S2; DEFINITION SIGNAL<br>A1, A2; COEFFICIENT SIGNAL<br>ON, OFF; CODING AMOUNT CONTROL | | PREVENTION OF DETERIORATION | | NON-PREVENTION OF DETERIORATION | |
|---|---|---|---|---|---|
| | | CODED | UNCODED | CODED | UNCODED |
| MAGNITUDE COMPARISON | S1 ≧ S2 | S1<br>A1<br>OFF | S2<br>A2<br>ON | S1 OR S2<br>A1 OR A2<br>ON | S2<br>A2<br>ON |
| | S1 < S2 | S2<br>A1<br>ON | S2<br>A2<br>ON | S2<br>A1 OR A2<br>ON | S2<br>A2<br>ON |

F I G. 14

| INPUT DATA | Amp | NON-ZERO COEFFICIENT DATA CODE |
|---|---|---|
| -1, 1 | 1 | 0, 1 |
| -3, -2, 2, 3 | 2 | 00, 01, 10, 11 |
| -7, ---, -4, 4, ---, 7 | 3 | 000, 001, 010, 011, 100, 101, 110, 111 |
| -15, ------, -8, 8, ---, 15 | 4 | ------ |
| -31, ---------, -16, 16, --------, 31 | 5 | ------ |
| ------ | | ------ |

F I G. 15

|  |  |  |  |
|---|---|---|---|
| 128 | 43 | 3 | 0 |
| -12 | 0 | 0 | 0 |
| -4 | 0 | 0 | 0 |
| 1 | 0 | 0 | -1 |

FIG. 16

(A) DATA SEQUENCE (SCAN SEQUENCE)   (43, -12, -4, 0, 3, 0, 0, 0, 1, 0, 0, 0, 0, 0, -1)

(B) ZERO RUN & DATA   $\begin{pmatrix} ZRM \\ DATA \end{pmatrix}$   $\begin{pmatrix} 0 \\ 43 \end{pmatrix}, \begin{pmatrix} 0 \\ -12 \end{pmatrix}, \begin{pmatrix} 0 \\ -4 \end{pmatrix}, \begin{pmatrix} 1 \\ 3 \end{pmatrix}, \begin{pmatrix} 3 \\ 1 \end{pmatrix}, \begin{pmatrix} 5 \\ -1 \end{pmatrix}$ (C) ZERO RUN AMP DATA   $\begin{pmatrix} ZRM \\ AMP \\ DATA \end{pmatrix}$   $\begin{pmatrix} 0 \\ 6 \\ 43 \end{pmatrix}, \begin{pmatrix} 0 \\ 4 \\ -12 \end{pmatrix}, \begin{pmatrix} 0 \\ 3 \\ -4 \end{pmatrix}, \begin{pmatrix} 1 \\ 2 \\ 3 \end{pmatrix}, \begin{pmatrix} 3 \\ 1 \\ 1 \end{pmatrix}, \begin{pmatrix} 5 \\ 1 \\ -1 \end{pmatrix}$ (D) HUFFMAN CODE NON-ZERO COEFFICIENT DATA   $\begin{pmatrix} HUFFMAN \\ CODE\ DATA \end{pmatrix}$   $\begin{pmatrix} H06 \\ 43 \end{pmatrix}\begin{pmatrix} H04 \\ -12 \end{pmatrix}\begin{pmatrix} H03 \\ -4 \end{pmatrix}\begin{pmatrix} H12 \\ 3 \end{pmatrix}\begin{pmatrix} H31 \\ 1 \end{pmatrix}\begin{pmatrix} H51 \\ -1 \end{pmatrix}$

FIG. 17

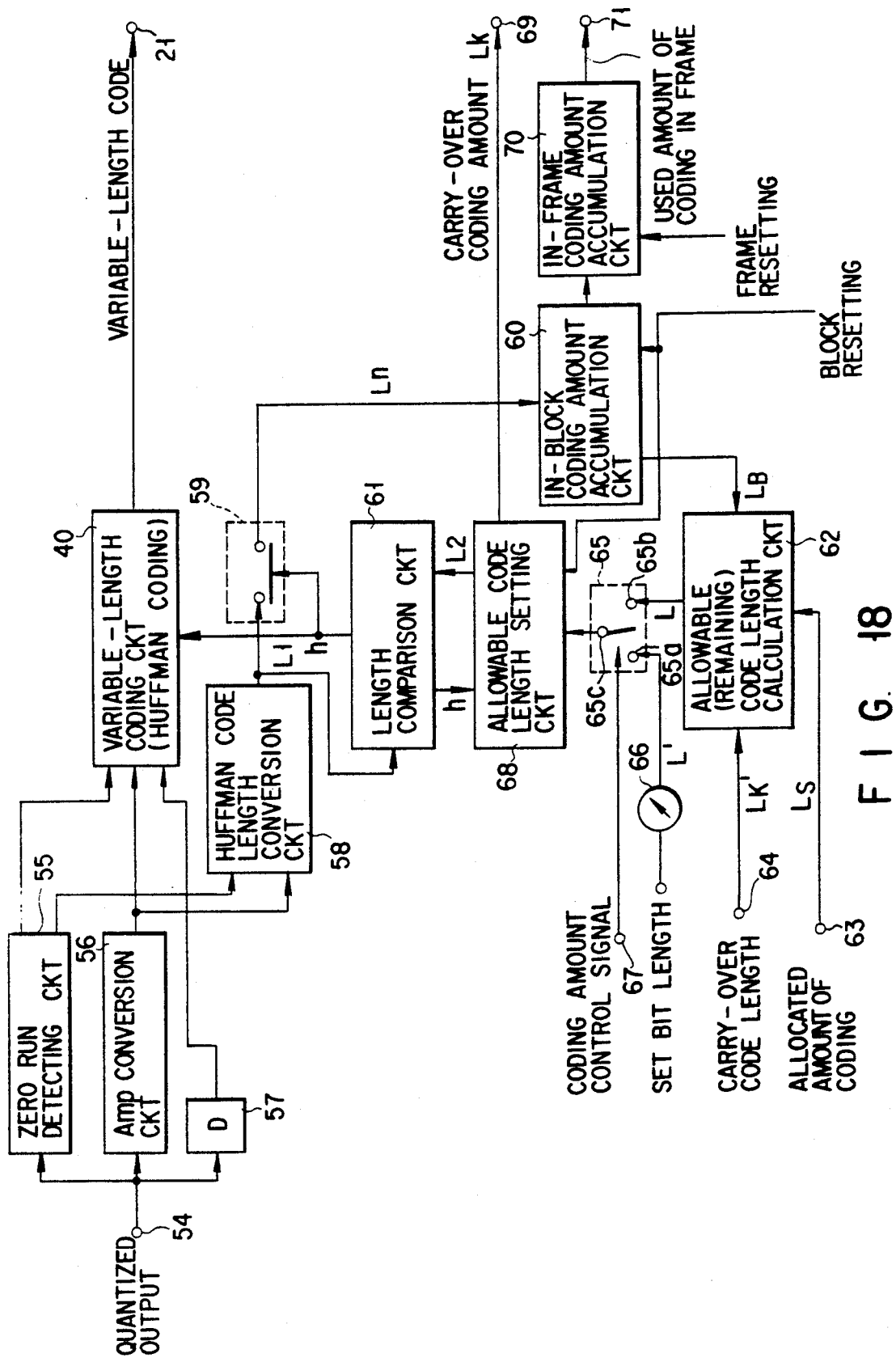
F I G. 18

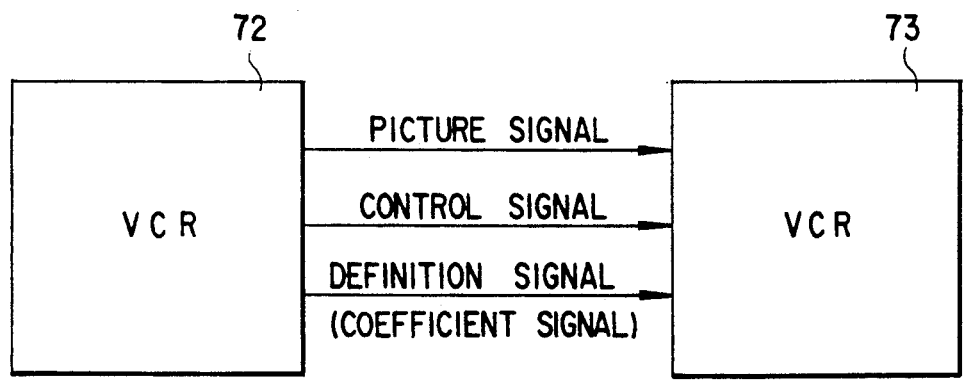
F I G. 19

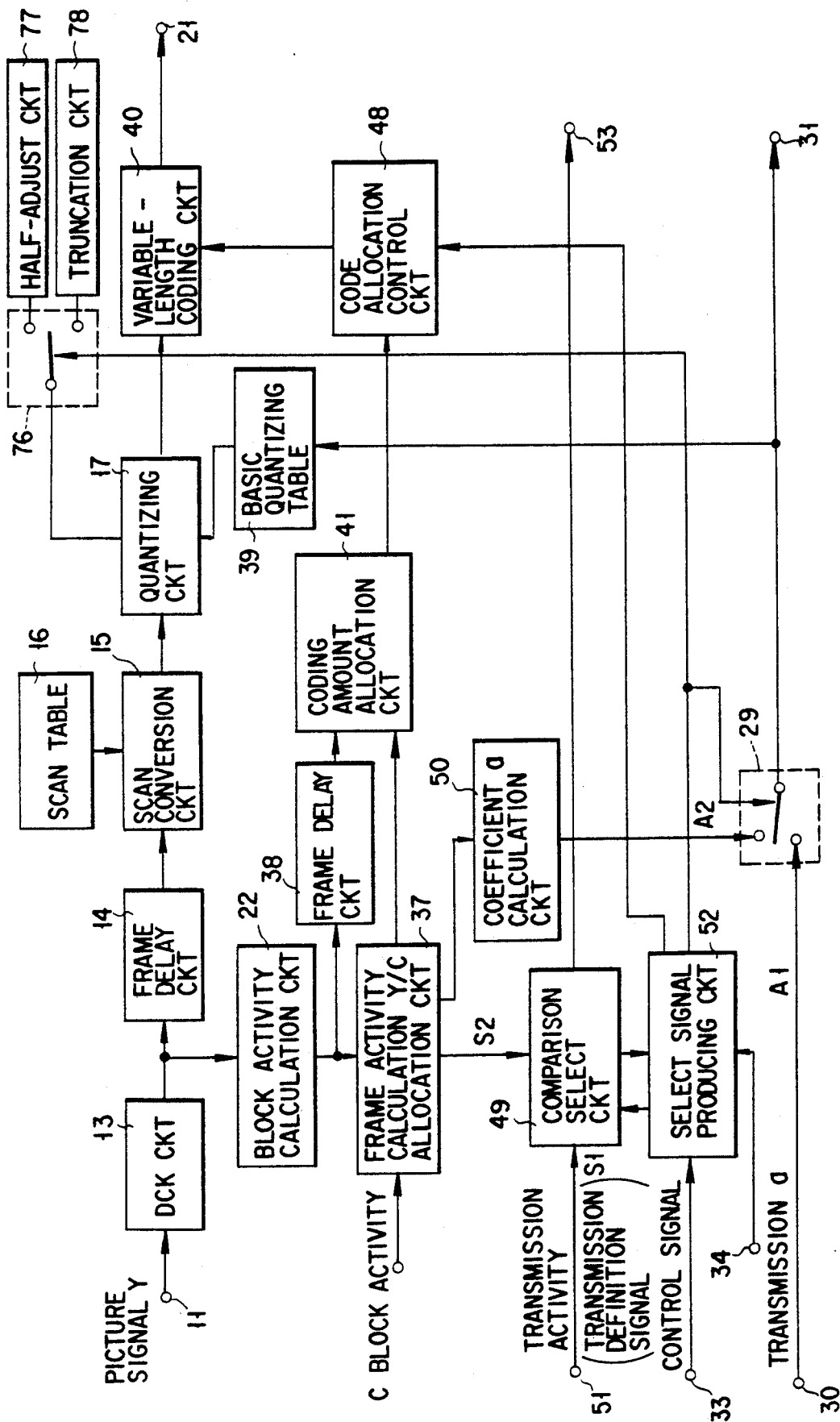
F I G. 22

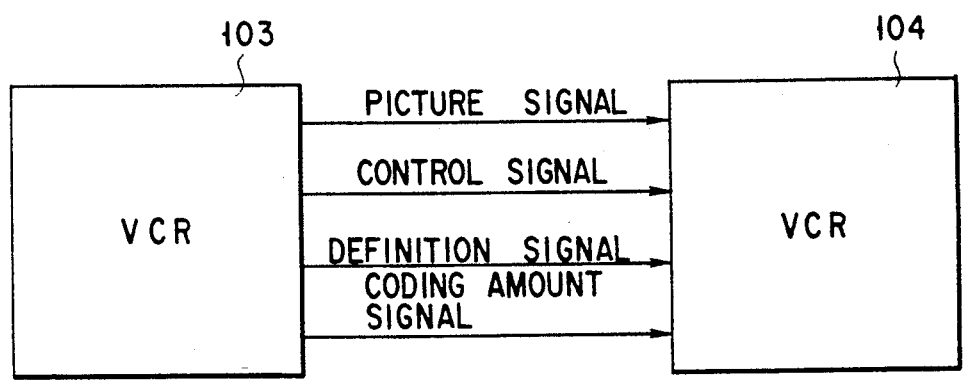
F I G. 25

RECORDING/REPRODUCING APPARATUS INCLUDING CONTROL SIGNAL INDICATING HIGH-EFFICIENCY CODING

BACKGROUND OF THE INVENTION

1. Field of the Invention

The present invention relates to a recording/reproducing apparatus for recording transmitted information signals, such as digital picture data, on a recording medium in a high-efficiency coded form and reproducing the original information signals by decoding high-efficiency coded signals read from the magnetic medium. More specifically, the present invention relates to a recording/reproducing apparatus which prevents data deterioration due to the high-efficiency coding at a time of double recording (hereinafter referred to as dubbing) for recording information signals reproduced from a recording medium to another recording medium.

2. Description of the Related Art

As is well known, the standardization of techniques of high-efficiency coding of digital data is being pushed actively. At present there are three standards: Recommendation H261 for television conference/television telephone; JPEG (Joint Picture Experts Group) for color still pictures; and MPEG (Moving Picture Experts Group) for storage media such as CD (Compact Disc)—ROM (Read Only Memory) (NIKKEI ELECTRONICS, 1990. 10. 15 (No. 511) P.124-P.129). On the other hand, digital recording/reproducing apparatus is also being developed which records information signals on recording medium in a high-efficiency coded form and decoding high-efficiency coded information signals read from the recording medium to thereby reproduce original information signals. As such a digital recording/reproducing apparatus, video cassette recorders (VCRs) using magnetic tape as recording medium and IC (Integrated Circuit) memory devices using semiconductor memories as recording media have been developed.

At present the leading high-efficiency coding technique uses orthogonal transformation which is referred to as DCT (Discrete Cosine Transform).

FIG. 1 illustrates a prior art high-efficiency coding system using the DCT technique. In FIG. 1, an input terminal 11 is supplied with a digital picture signal as an effective transmission information signal. The digital picture data is transmitted on a field-sequential basis in the NTSC system. Thus, a successive two fields stored in a frame memory 12 produce one frame of digital picture signal. In this case, the digital picture data is produced by encoding a luminance signal Y, a red signal component Cr and a blue signal component Cb. Unless otherwise specified, the luminance signal Y is taken as an example in the following description.

When one frame of digital picture data is sampled at, for example, 4 fsc (14.3 MHz), the number of pixels on one horizontal line is 910 because there are 910 samples in the horizontal direction. There are 525 lines in the vertical direction and thus the number of pixels in the vertical direction is 525. That is, the total number of pixels at the time of sampling is 910×525. However, only about 80% of the total number of pixels (768 pixels in the horizontal direction×488 pixels in the vertical direction) can be watched on the screen as effective pixels. The effective pixels form digital picture data applied to the input terminal as an effective transmit information signal. One frame of digital picture data stored in the frame memory 12 is read in blocks of four pixels (horizontal)×four pixels (vertical) and applied to a DCT circuit 13 where the digital data is subjected to an orthogonal transformation process on a block-by-block basis.

The orthogonal transformation transforms digital picture data from time axis to frequency axis on a block basis and produces low frequency components and high frequency components in the order of increasing frequency two-dimensionally in the horizontal and vertical directions. The data is arranged such that it changes from direct current through low frequency to high frequency as an arrow indicating a zigzag scan shown in FIG. 2 advances in the horizontal and vertical directions. The data subjected to the orthogonal transformation is delayed by a frame delay circuit 14 by a one-frame period of time corresponding to a calculating time of an activity calculation circuit 22 described later and then applied to a scan conversion circuit 15.

The scan conversion circuit 15 scans data of a block in such a zigzag manner as indicated by an arrow of FIG. 2 on the basis of the contents recorded in a standard scan table 16 and rearranges them one-dimensionally so that direct current components and high frequency components can be output in sequence in the order of increasing frequency in the horizontal and vertical directions. This is because, from the standpoint of reproduction of an original image when the bit rate is decreased, sequential transmission of a direct current component and a high frequency component in the order of increasing frequency can reproduce a visually good image at a lower bit rate and, hence, with higher efficiency. The data scanned and converted in such a manner is generally larger in data amount than the original digital image data. Thus, data compression is not achieved without modification. For this reason, a quantization circuit 17 is used for requantization.

The quantization circuit 17 decreases data amount by dividing the scan-converted data by the result of multiplication of the contents recorded in a basic quantization table 18 and a coefficient a, which will be described later, by a multiplication circuit 19. The data requantized by the quantization circuit 17 is further applied to a variable-length coding circuit 20 for efficient transmission coding. The coding technique, which is most used by the variable-length coding circuit 20 is the Huffman coding or Run length coding, in which the number of successive 0s and the number of the following digits other than 0 in a requantized output are combined to allocate fewer bits in the order of decreasing probability of its occurrence. The number of bits is two at a minimum and several tens at a maximum. Thus, the data compression is performed on the digital image data. The data subjected to the data compression is taken from an output terminal 21 and then recorded on a recording medium (not shown).

In order to compress data while keeping picture quality, the requantizing process by the quantization circuit 17 is the most important. The performance of the requantization depends on calculation of the coefficient a, by which the basic quantization table 18 is multiplied, according to the basic quantization table 18 and the input digital image data. The picture definition (a rate at which fine detail and high frequency components are contained in a picture) is used for the calculation. That is, the coefficient a is calculated by the activity calculation circuit 22 using, as a measure of evaluation, a standard deviation or a quantity extracted from high frequency components output from the DCT circuit 13. The result of this calculation is converted to the coefficient a by a coefficient conversion circuit 23, which is in turn applied to a multiplication circuit 19.

At the time of reproducing of the high-efficiency coded data from the recording medium, the variable-length coded data is read from the recording medium and then subjected to processes which are the inverse of those at the time of the coding of data, i.e., inverse quantization, inverse scan conversion and inverse DCT processing. Thereby, the original digital picture data is recovered and displayed as a picture.

However, the conventional high-efficiency coding system using the DCT technique described above suffers from the following problems. Suppose now that an original picture signal is recorded on a first recording medium in the high-efficiency coded form. Further suppose that such outputs of the scan conversion circuit 15 as shown in FIG. 3A are applied to the quantization circuit 17, such contents as shown in FIG. 3B are recorded in the basic quantization table 18 and the coefficient a at this time is 2. Then, the quantization circuit 17, which multiplies each of the values of the basic quantization circuit 18 by the coefficient "2" and divides a corresponding input value of the quantization circuit 17 by each of the multiplication results. As shown in FIG. 3C, therefore, each output of the quantization circuit 17 is decreased in quantity of data. The data compressed as shown in FIG. 3C is subjected to the variable-length coding process and then recorded on the first recording medium.

At the time of reproducing of the first recording medium, expansion of data is performed by the inverse quantization processing of multiplying each input value of the basic quantization table 18 by the coefficient "2" used at the time of the compression and multiplying each value compressed as shown in FIG. 3C by a corresponding one of the multiplication results. In this case, as shown in FIG. 3D, of the results of the inverse quantization, the portions marked with ×have values smaller than corresponding original values shown in FIG. 3A. That is, data deterioration occurs in those portions. However, with the high-efficiency coding process using the DCT technique, such a degree of data deterioration is inevitable because it is an irreversible coding system and is not a problem to be solved by the present invention (at this time, truncating process is used for the calculation, discarding the decimal fractions).

A problem to be solved by the present invention arises when data is reproduced from the first recording medium and then recorded on a second recording medium, namely, at a time of dubbing. Suppose now that the outputs of FIG. 3D obtained by inverse quantization of the reproduced data from the first recording medium are recorded on the second recording medium. Suppose that, in the apparatus for recording data on the second recording medium, the coefficient a is calculated on the basis of the reduced data shown in FIG. 3D to be "1.8" which is 10% smaller than "2". Then, the recording apparatus multiplies each value of the basic quantization table 18 shown in FIG. 3B by the coefficient "1.8" and divides each value of FIG. 3D by a corresponding one of the multiplication results. As a result, values shown in FIG. 4A are obtained. The data compressed as shown in FIG. 4A is recorded variable-length coded on the second recording medium.

At the time of reproducing of the second recording medium, the apparatus performs data expansion by the inverse quantizing process of multiplying each value of the basic quantization table by the coefficient "1.8" used at the time of the data compression and multiplying each of the values compressed as shown in FIG. 4A by a corresponding one of the multiplication results. FIG. 4B shows the results of the inverse quantization. All the values are smaller than corresponding values of FIG. 3D and data is deteriorated considerably. If data reproduced from the second recording medium is dubbed onto a third recording medium, more serious data deterioration will occur.

That is, a problem arises in the case of dubbing digital data reproduced from a recording medium onto another recording medium using the high-efficiency coding and decoding system in that the more the number of times of the dubbing increases, the greater is the data deterioration due to the use of the irreversible high-efficiency coding and decoding system.

SUMMARY OF THE INVENTION

It is accordingly an object of the present invention to provide a recording/reproducing apparatus which permits data deterioration to be suppressed to a minimum in recording an information signal subjected to high-efficiency coding on a recording medium and decoding it at the time of reproducing thereof and is suitable for dubbing the information signal.

According to an aspect of the present invention there is provided a recording/reproducing apparatus for recording a coded signal obtained by performing a high-efficiency coding process on an information signal and reproducing the original information signal by performing a decoding process corresponding to the high-efficiency coding process on the coded signal read from the recording medium, comprising:

input terminals respectively connected to receive the information signal, a control signal indicating whether or not the information signal has been subjected to the high-efficiency coding and decoding processes and a specific signal indicating a specific value used in the high-efficiency coding and decoding processes when the information signal has been subjected to the high-efficiency coding and decoding processes;

coding circuit for performing a high-efficiency coding process on the input information signal using a specific value produced on the input information signal when the control signal indicates that the input information signal has not been subjected to the high-efficiency coding and decoding processes, producing a coefficient signal indicating the produced specific value and a control signal indicating the information signal has been subjected to the high-efficiency coding and decoding processes and performing a high-efficiency coding process on the input information signal on the basis of the specific value indicated by the input specific signal when the input control signal indicates that the input information signal has been subjected to the high-efficiency coding and decoding processes;

recording circuit for recording the information signal subjected to the high-efficiency coding process by the coding circuit on the recording medium together with the control signal and the specific signal produced by the coding circuit or input to said input terminals;

reproducing circuit for reading the coded signal, the control signal and the specific signal from the recording circuit; and decoding circuit for performing a decoding process on the coded signal read by the reproducing circuit on the basis of the specific value indicated by the read specific signal and outputting the information signal subjected to the decoding process together with the read control and specific signals.

BRIEF DESCRIPTION OF THE DRAWINGS

FIGS. 3A through 3D are diagrams for use in explanation of a high-efficiency coding and decoding process;

FIGS. 4A and 4B are diagrams for use in explanation of data deterioration due to the high-efficiency coding and decoding process at the time of dubbing of a picture information signal;

FIGS. 5A and 5B are diagrams for use in explanation of the principle of the present invention;

FIG. 8 is a detailed block diagram of a high-efficiency coding circuit in the data recording system of FIG. 7;

FIG. 10 is a diagram for use in explanation of the operating principle of a second embodiment of the present invention;

FIG. 11 is a block diagram of the second embodiment of the present invention;

FIG. 13 is a detailed block diagram of the high-efficiency coding circuit of the data recording system of FIG. 12;

FIG. 14 is a diagram illustrating input and output relationships of the select signal producing circuit of the high-efficiency coding circuit of FIG. 13;

FIG. 15 is a diagram for use in explanation of the huffman coding by the quantization circuit of the high-efficiency coding circuit of FIG. 13;

FIG. 16 is a diagram for use in explanation of huffman coded outputs of the quantization circuit of FIG. 13;

FIGS. 17A through 17D are diagrams for use in explanation of data sequence of the huffman coded outputs of the quantization circuit, a relationship between zero run and data, a relationship among zero run, amp and data and a relationship between huffman code and non-zero coefficient data;

FIG. 18 is a detailed block diagram of the variable-length coding block of the high-efficiency coding circuit of FIG. 13;

FIG. 19 is a block diagram illustrating a third embodiment of the present invention;

FIG. 22 is a block diagram of a fourth embodiment of the present invention;

FIG. 25 is a block diagram of a seventh embodiment of the present invention.

DETAILED DESCRIPTION OF THE PREFERRED EMBODIMENTS

Before describing the embodiments of the present invention the principle of the present invention will be described. In the above description of the prior art, when data decoded as shown in FIG. 3D is recorded on the second recording medium, the coefficient "1.8" calculated on the basis of the data is used for quantization. Thus, such quantized outputs as shown in FIG. 4A are obtained. Further, the coefficient "1.8" is used for inverse quantization, so that such data deterioration as shown in FIG. 4B occurs. However, when data decoded as shown in FIG. 3D is recorded on the second medium, if the coefficient "2" used at the time of the coding of the data is used for requantization, each value of FIG. 3D is divided by a corresponding one of values obtained by multiplying the contents of the basic quantization table shown in FIG. 3B by the coefficient "2". Thus, the results of the requantization will become as shown in FIG. 5A.

Here, the results of the requantization shown in FIG. 5A are naturally identical to those when the original image signal shown in FIG. 3C is recorded on the first recording medium. For this reason, the results of the requantization of data reproduced from the second recording medium will be identical to those shown in FIG. 3D as shown in FIG. 5B if the coefficient "2" is used. If, therefore, the quantization coefficient "2" used for recording the original picture signal is used for subsequent high-efficiency coding and decoding, the data deterioration due to the high-efficiency coding and decoding will not occur at all regardless of the number of times of dubbing unless the basic quantization table 18 is changed.

Figure 6:
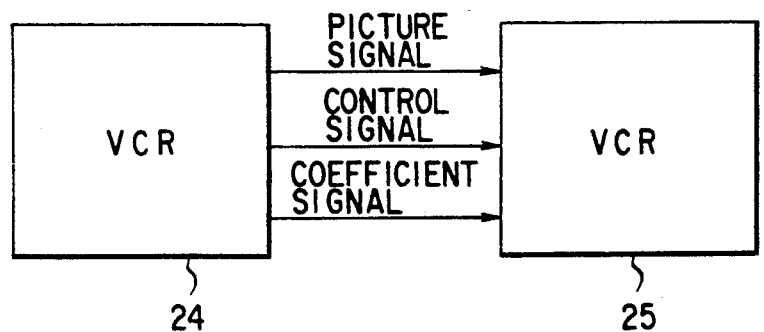
FIG. 6 is a block diagram of a recording/reproducing apparatus according to an embodiment of the present invention.

Hereinafter, an embodiment of the present invention based on the above principle will be described. In this embodiment, as apparatus for recording digital picture data on and reproducing it from a recording medium, a helical scan VCR is used which uses magnetic tape as the recording medium. As shown in FIG. 6, two VCRs 24 and 25 each having a high-efficiency coding and decoding function are prepared. When a picture signal reproduced by the VCR 24 is recorded by the VCR 25, a control signal indicating whether or not the picture signal has been subjected to the high-efficiency coding and decoding process in the past and a coefficient signal indicating a coefficient A1 when the picture signal has been subjected to the high-efficiency coding and decoding as well as the picture signal serving as an effective transmit information signal are transmitted from the VCR 24 to the VCR 25.

In this case, the control signal and the coefficient signal are recorded on magnetic tape (not shown) together with the picture signal. By reproducing the magnetic tape by the VCR 24, the control signal and the coefficient signal as well as the picture signal are applied to the VCR 25. When it is decided from the contents of the control signal that an input picture signal has not been subjected to the high-efficiency coding and decoding process, the VCR 25 itself calculates the coefficient A2 on the basis of the input picture signal. The VCR 25 performs the high-efficiency coding process on the picture signal using the coefficient A2 and records it on magnetic tape. On the other hand, when it is decided that the input picture signal has been subjected to the high-efficiency coding and decoding process, the VCR 25 performs the high-efficiency coding process on the input picture signal on the basis of the coefficient A1 specified by the coefficient signal and then records it on magnetic tape.

Figure 7:
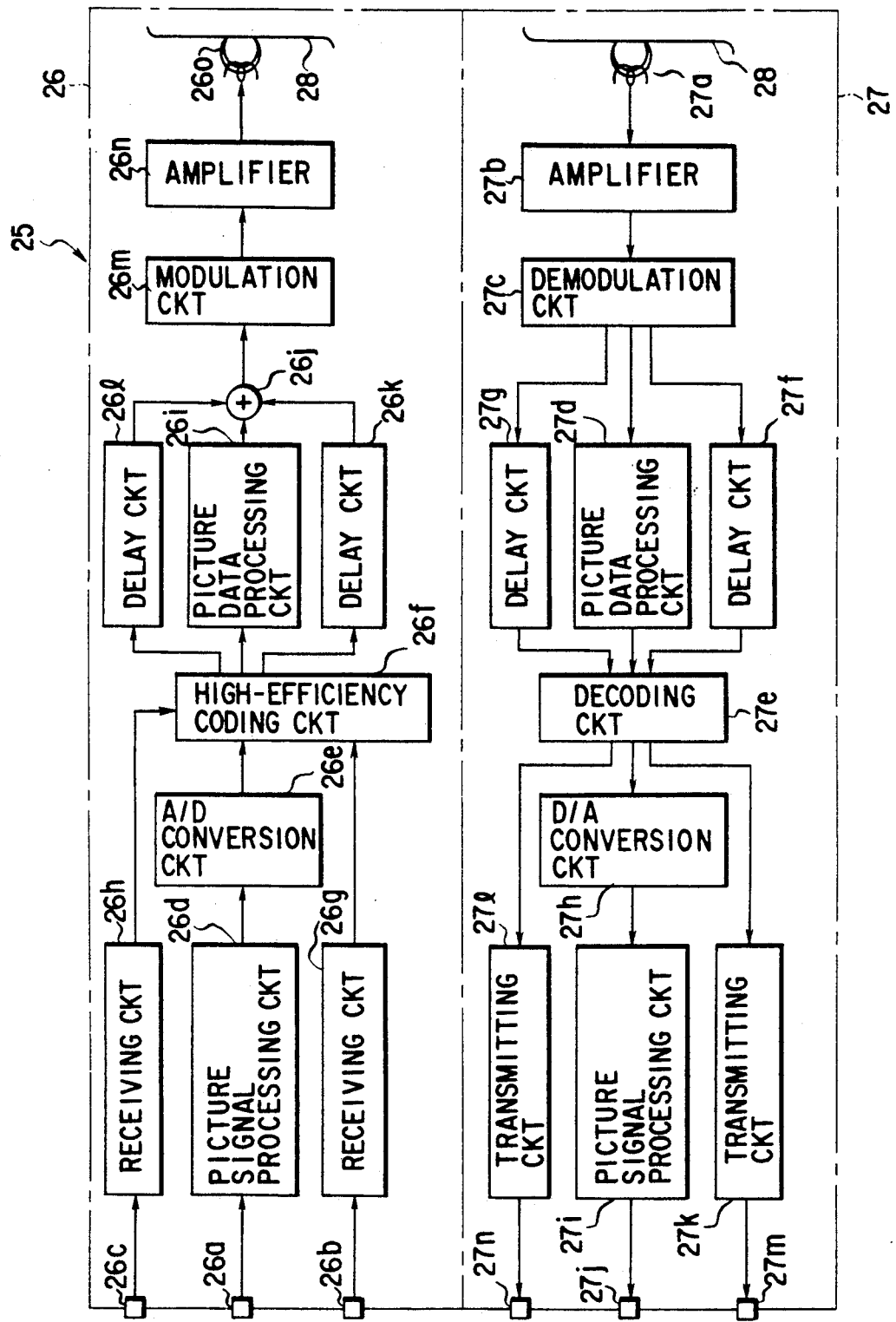
FIG. 7 is a block diagram illustrating data recording and reproducing systems of a VCR of FIG. 6.

FIG. 7 is a detailed block diagram of the VCR 25. The VCR 24 is the same in configuration as the VCR 25 and thus description thereof is omitted herein. The VCR 25 comprises a data recording system 26 and a data reproducing system 27. The data recording system 26 has a picture signal input terminal 26a to which a picture signal is applied externally, a control signal input terminal 26b to which a control signal is applied externally and a coefficient signal input terminal 26c to which a coefficient signal is applied externally. After being subjected to predetermined picture signal processing in a picture signal processing circuit 26d, a picture signal in analog form applied to the picture signal input terminal 26a is converted to a digital picture signal by an A/D (analog/digital) converter 26e and then applied to a high-efficiency coding circuit 26f.

A control signal applied to the control signal input terminal 26b is received by a receiving circuit 26g and then applied to the high-efficiency coding circuit 26f. Further, a coefficient signal applied to the coefficient signal input terminal 26c is received by a receiving circuit 26h and then applied to the high-efficiency coding circuit 26f. The high-efficiency coding circuit 26f performs a high-efficiency coding process on the input digital picture signal on the basis of the control signal and the coefficient signal for subsequent transmission to a picture signal processing circuit 26i. The picture signal processing circuit 26i performs an error correcting parity adding process and a predetermined interleaving process on the input digital picture signal and applies its output signal to an adder circuit 26j. The control signal and the coefficient signal, which are output from the high-efficiency coding circuit 26f, are delayed by delay circuits 26k and 26l, respectively, by a processing time of the picture signal processing circuit 26i and then added to the digital picture signal in the adder circuit 26j. The digital picture signal, which is output from the adder circuit 26j and accompanied by the control signal and the coefficient signal, is subjected to modulation in a modulation circuit 26m, amplified by a recording amplifier 26n and then recorded on magnetic tape 28 by a recording head 26o on a helical scan basis.

On the other hand, the data reproducing system 27 has a reproducing head 27a for tracing the magnetic tape 28 to read the recorded signal. The recorded signal read by the reproducing head 27a is amplified by a reproduce amplifier circuit 27b and then demodulated by a demodulator circuit 27c, whereby the recorded signal is separated into the digital picture signal, the control signal and the coefficient signal. The digital picture signal is applied to a picture signal processing circuit 27d for error correcting and deinterleaving processes and then applied to a decoding circuit 27e. The control signal and the coefficient signal are delayed by delay circuits 27f and 27g, respectively, by a processing time taken by the picture signal processing circuit 27d to process the digital picture signal and then applied to a decoding circuit 27e, so that the digital picture signal is decoded on the basis of the control signal and the coefficient signal.

The digital picture signal output from the decoding circuit 27e is converted by a D/A (digital/analog) converter circuit 27h to an analog picture signal which is, in turn, subjected to predetermined picture signal processing by a picture signal processing circuit 27i and taken out from a picture signal output terminal 27j. The control signal and the coefficient signal are output from the decoding circuit 27e and then taken out from a control signal terminal 27m and a coefficient signal output terminal 27n via transmission circuits 27k and 27l, respectively.

Figure 1:
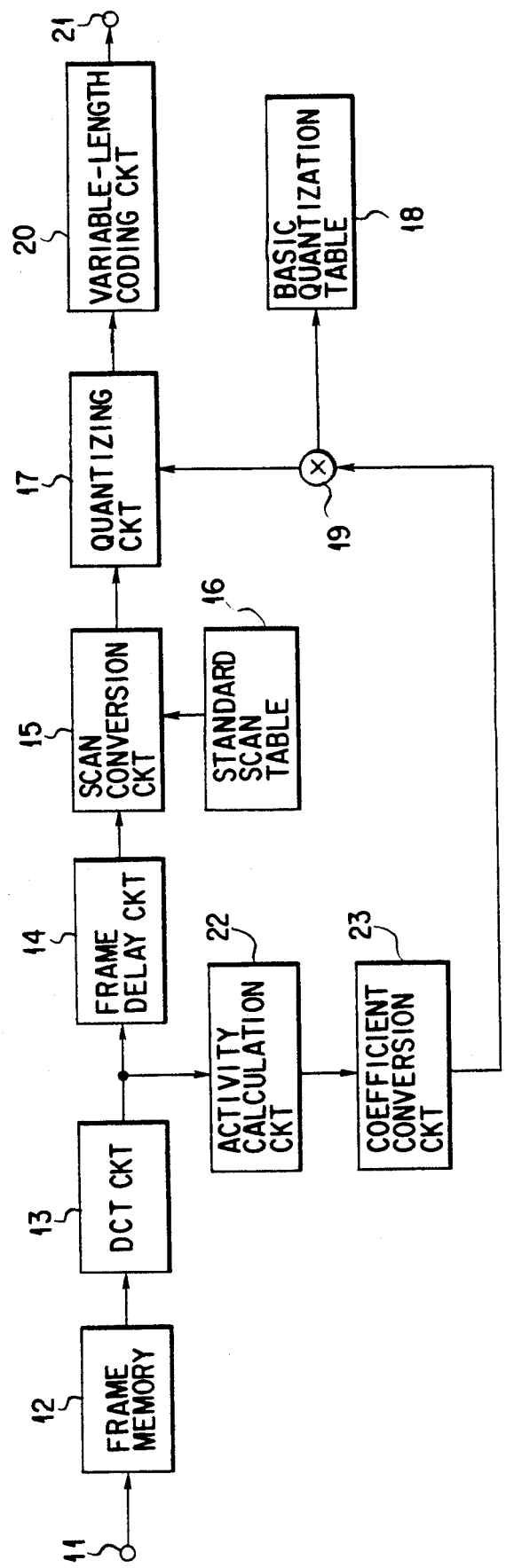
FIG. 1 is a block diagram of a high-efficiency coding circuit using DCT.

FIG. 8 is a detailed block diagram of the high-efficiency coding circuit 26f. In this figure, corresponding parts to those in FIG. 1 are designated by like reference numerals. The frame memory 12 connected between the input terminal 11 and the DCT circuit 13 is omitted for simplicity. The coefficient A2 output from the coefficient conversion circuit 23 is applied to a first fixed contact of a switch circuit 29 having its second fixed contact 29b connected to receive the coefficient A1 based on the coefficient signal output from the receiving circuit 26h. The coefficient A1 or A2 selected by the switch circuit 29 is applied to the multiplication circuit 19 via a common contact 29c and to the delay circuit 61 via the output terminal 31.

The switch circuit 29 is controlled by a switching signal output from a control circuit 32. The control circuit 32 is responsive to application of the control signal from the receiving circuit 26g via an input terminal 33 to produce the switching signal. When the control signal indicates that a picture signal input to the picture signal input terminal 26a has not been subjected to the high-efficiency coding and decoding process in the past, the control circuit 32 causes the switch circuit 29 to select the coefficient A2. When the control signal indicates that the picture signal has been subjected to the high-efficiency coding and decoding process in the past, on the other hand, the control circuit causes the switch circuit to select the coefficient A1. Upon receipt of a switching specification signal from a user via an input terminal 34, the control circuit 32 controls the switch circuit 29 as the user specifies. That is, the switching specification signal is given precedence over the control signal.

The control circuit 32 changes a control signal indicating that the picture signal has not been subjected to the high-efficiency coding and decoding process in the past to a control signal indicating that the input picture signal has been subjected to the high-efficiency coding and decoding process and then outputs it to the delay circuit 26k via the output terminal 35. On the other hand, when a control signal indicates that an input picture signal has been subjected to the high-efficiency coding and decoding process, the control circuit outputs it to the delay circuit 26k via the output terminal 35 as it is.

According to the embodiment, in the case of dubbing a reproduced picture signal from the VCR 24 by the VCR 25, not only the picture signal but also a control signal indicating whether or not the picture signal has been subjected to the high-efficiency coding and decoding process and a coefficient signal indicating a coefficient A1 when the picture signal has been subjected to the high-efficiency coding and decoding process are transmitted from the VCR 24 to the VCR 25. When the transmitted picture signal has not been subjected to the high-efficiency coding and decoding process, the VCR 25 itself produces the coefficient A2 and performs the high-efficiency coding process on the basis of A2. The VCR 25 records on the magnetic tape 28 a coefficient signal indicating the coefficient A2 and a control signal indicating that the picture signal has not been subjected to the high-efficiency coding and decoding process as well as the digital picture signal. When a picture signal has been subjected to the high-efficiency coding and decoding process in the past, the VCR 25 performs the high-efficiency coding and decoding process on the basis of the input coefficient A1 and records on the magnetic tape 28 a coefficient signal indicating the coefficient A1, a control signal indicating that the picture signal has been subjected to the high-efficiency coding and decoding process and a digital picture signal. For this reason, when recording a digital picture signal which has been subjected to the high-efficiency coding and decoding process in the past on the magnetic tape 28 in high-efficiency coded form and reproducing it from the tape, the deterioration of the digital picture signal can be suppressed to a minimum. This is specially adapted for dubbing.

The recording/reproducing apparatus described above also calculates cumulative activity on a frame basis using block activity (the definition of the block unit). When the accumulative activity is maintained at a fixed rate or the amount of coding per frame is set to be smaller than a predetermined upper limit value, data may be dropped.

Figure 9:
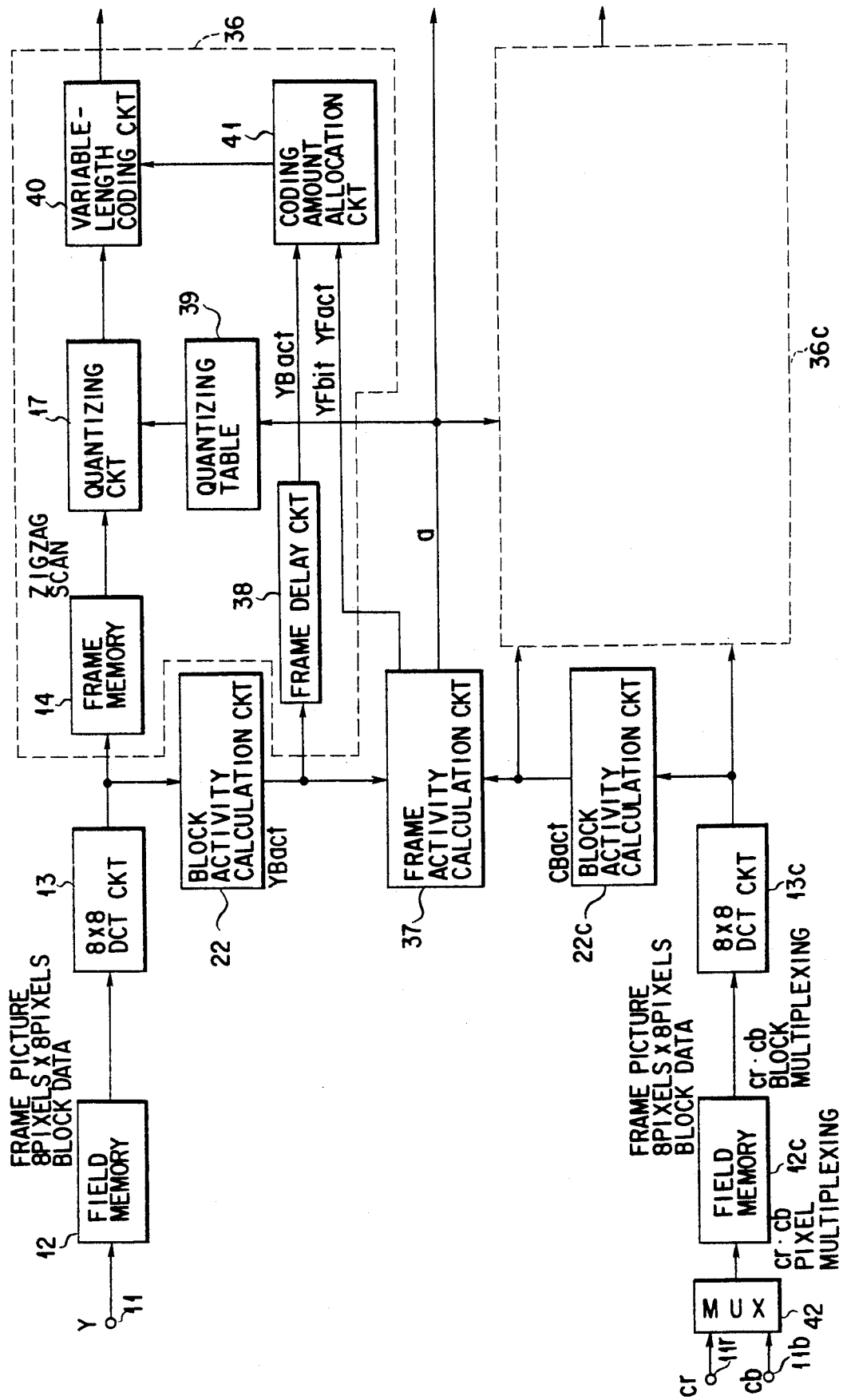
FIG. 9 is a block diagram of luminance and color signal systems of the high-efficiency coding circuit of FIG. 8.

FIG. 9 is a block diagram illustrating the data dropout. First, a bit allocating operation for a fixed rate will be described. An output of a block activity calculation circuit 22 for producing the definition YBact of each of blocks of a luminance signal Y and an output of a block activity calculation circuit 22c for producing the definition CBact of each block of color signals Cr and Cb are input to a frame activity calculation circuit 37. The frame activity calculation circuit 37 accumulates activities YBact, CBact of each block during one-frame period, calculates activities (frame activities) in one frame YFact, CFact and obtains the ratio between the amounts of coding allocated to the luminance signal Y and the color signal C from the block activity and the frame activity.

Next, the frame activity calculation circuit 37 obtains the amount of coding (data amount or the number of bits; hereinafter referred to as the number of allocated bits) YFbit, CFbit available to each of the luminance signal Y and the color signal C within one frame. The frame activity calculation circuit 37 adds the frame activity YFact and CFact and calculates the average activity Aact of each block. The average activity Aact is converted to a quantization coefficient a, which is, in turn, input to a quantization table 39 to calculate quantized values. The quantization table 39, as shown in FIGS. 1 and 8, may merely multiply stored data by the coefficient a.

The block activity YBact, calculated by the block activity calculation circuit 22, is delayed by a frame delay circuit 38 by the time required by the frame activity calculation circuit 37 to calculate the frame activity YFact and the number of allocated bits and then input to a coding amount allocation circuit 41. The allocation circuit 41 is also supplied with the number of allocated bits YFbit and the frame activity YFact and calculates the number of allocated bits YBbit available to each block using YBact, YFbit and YFact. The number of allocated bits YBact is given by $$YBbit = YFbit \times YBact/YFact$$

Since the accumulated sums of the number of allocated bits TBact and the block activity YBact in one frame are YFbit and YFact, respectively, the system permits the number of codes of each frame to be made constant. Suppose now that an output of the quantization circuit 17 is variable-length coded by the variable-length coding circuit 40 and the number of bits allocated to it is n2 bits. Suppose that the actual number of codes is n1 bits. Then, when n1>n2, namely, when the number n1 of bits of a quantized output is smaller than n2, the variable-length coding circuit 40 outputs only data whose bits are equal to or smaller in number than n2 as variable-length coded data. When n1<n2, the variable-length coding circuit 40 outputs the quantized output as it is as variable-length coded data. The variable-length coding circuit 40 performs the bit allocating operation in this way and thus it has a bit limiting function.

In this way, the apparatus of FIG. 7 is applied to the system for making the number of codes per frame constant and the coefficient a is applied to the quantization table 39. In this case, the coding amount allocating operation is performed using an activity signal calculated from a transmitted information signal and thus the result of the allocation of the amount of coding will slightly differ from the last result. When the number of allocated codes is large as in the case of a luminance signal Y, data deterioration is relatively small even if the number of allocated bits is limited due to a difference in the number of allocated codes. When the number of allocated codes is small as in the case of the color signal C, on the other hand, a difference in the result of allocation of the number of codes has a great influence on data deterioration and the effect of transmitting the coefficient a may not be produced noticeably. That is, with the system in which the number of codes per frame is made constant, data deterioration may occur because the result of the code allocation differs from the last result. The most simple means, as a countermeasure against data deterioration, may be to transmit coding amount allocation data and to perform allocation using the data. In this case, the quantity of data to be transmitted increases.

Hereinafter, an application of the present invention to the system in which the number of codes per frame is made constant will be described. In the above description, when data which has been coded and decoded is coded again, the coefficient a is transmitted so that data is recovered without data deterioration. When the number of codes per frame is made constant, data is variable-length coded allocated the number of codes which is different from that at the last time and thus some data will be thrown away without being variable-length coded.

Suppose that code allocation is performed such that, as shown in FIG. 10, the length of bits is limited to 100 bits on the basis of definitions (activities) of three blocks. In the first-time coding, codes are allocated to fit the definition of each of the blocks 1 to 3 and data is variable-length coded within the number Lo of allocated codes. For example, the actual number of allocated codes amounts to 98 in bit which is the sum of 29 and 45 in the blocks 1 to 3. Depending on code lengths for variable-length coding, codes may be allocated up to a range of the number of allocated codes Lo. For a reason that the number Lo of allocated codes is exceeded as in the block 1, there is a block whose coding is stopped and which is consequently coded in the number of bits which is one or more bits fewer than Lo. In the case of FIG. 10, the first-time variable-length coding is performed with a margin of a total of 2 bits left.

At the time of the next coding as well, the definition (activity) is calculated. In this case, the definition will be slightly different from that at the time of the first coding because of quantization. When code allocation is performed on the basis of the calculated definition, the number of allocated codes L1 will be different from Lo at the time of the first coding as shown in FIG. 10. For example, in the block 1, the number of codes at the first time is 22 bits, while the number of codes at the next time is 21.96 bits, so that all the coded data at the first time cannot be transmitted. This is due to a variation in definition, mixed noise, etc. In this case, as for the blocks 2 and 3, no data deterioration occurs as is evident from comparison therebetween in the actual number of codes. As to data of block 1, only 4 bits cannot be transmitted. That is, even in the case of dubbing of digital data, data deterioration occurs.

In FIG. 10, the definition at the time of the first coding is larger than that at the time of the second coding. At the time of the first coding, the number of bits used is not more than a predetermined value because of constant rate. For this reason, in the case of FIG. 10, the code allocation is not particularly needed for the next coding. In an embodiment described below, such a principle is utilized and the code allocating operation is controlled on the basis of a coefficient a and definition information.

That is, in FIG. 11, each of VCRs 43 and 44 has a high-efficiency coding and decoding function. The VCR 43 outputs to the VCR 44 a reproduced picture signal as an effective transmit information signal, a control signal indicating whether or not the picture signal has been subjected to the high-efficiency coding and decoding process in the past, a coefficient signal indicating a coefficient A1 when the picture signal has been subjected to the high-efficiency coding and decoding process and a definition signal indicating the definition (activity) S1 of the picture signal. In this case, the control signal, the coefficient signal and the definition signal have been recorded on magnetic tape (not shown) together with the picture signal and these signals are applied to the VCR 44 together with the picture signal by reproducing the magnetic tape by the VCR 43.

When it is decided from the contents of the control signal that the picture signal has never been subjected to the high-efficiency coding and decoding process, the VCR 44 calculates a coefficient A2 and a definition S2 for itself, performs high-efficiency coding and decoding process on the picture signal on the basis of these values and records the picture signal on magnetic tape. On the other hand, when it is decided from the contents of the control signal that the picture signal has been subjected to the high-efficiency coding and decoding in the past, the VCR 44 uses the transmitted coefficient A1 and turns the coding amount allocation circuit 41 on or off on the basis of a comparison in magnitude between the transmitted definition S1 and a definition S2 obtained by calculation. That is, when $S1 \geq S2$, though the transmitted coefficient A1 is used, the coding amount allocation is not performed. When $S1 < S2$, the coefficient A1 is used and the coding amount allocation is performed. Namely, the coefficient A2 calculated by the VCR 44 is used only when a control signal indicating that the picture signal has not been subjected to coding is input. The VCR 44 performs the high-efficiency coding process on a transmitted picture signal on the basis of these set conditions and records coded data on magnetic tape.

Figure 12:
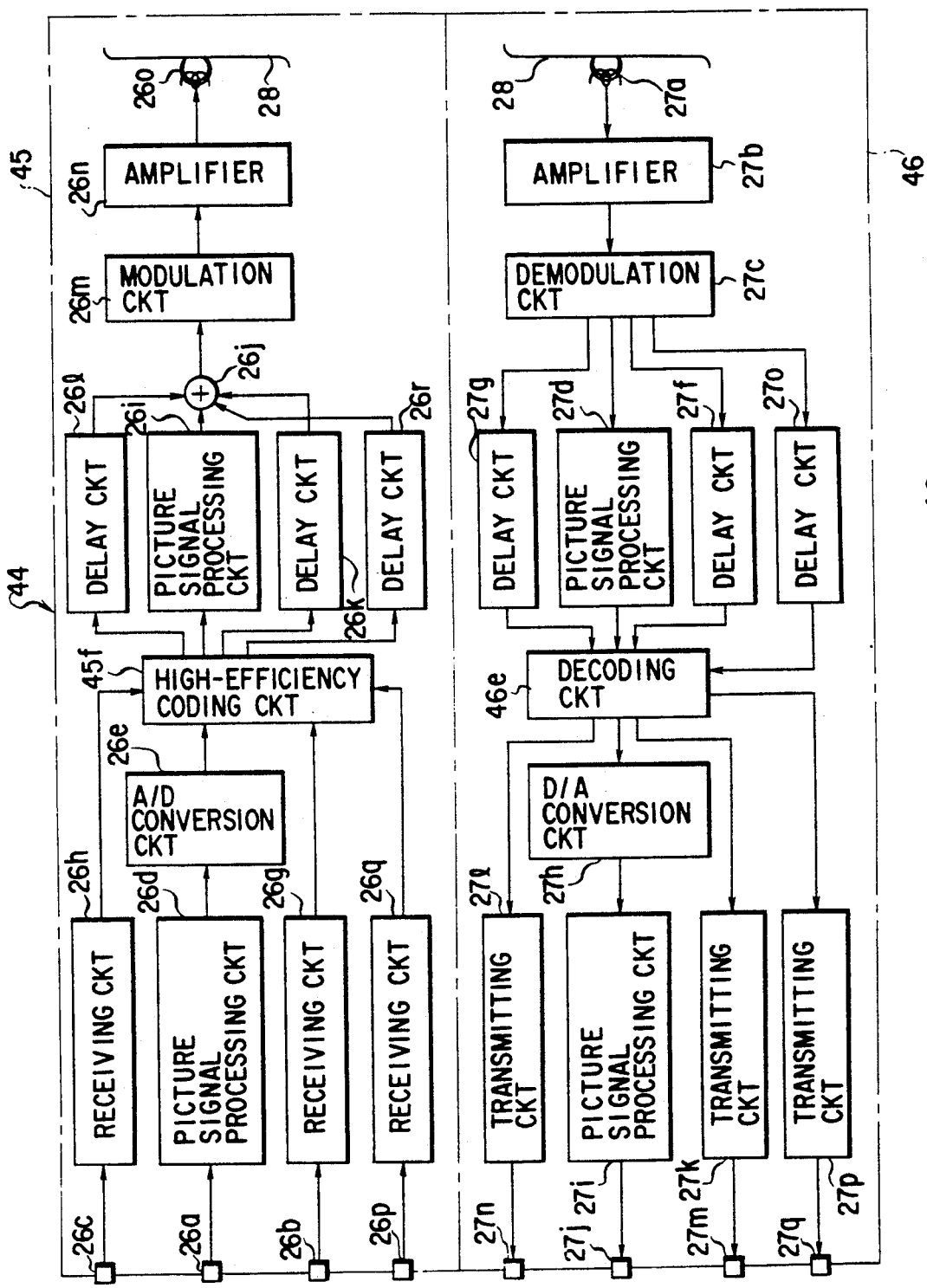
FIG. 12 is a block diagram of data recording and reproducing systems of a VCR of FIG. 11.

FIG. 12 is a detailed block diagram of the VCR 44 and corresponding parts to those in FIG. 7 are designated by like reference numerals. The VCR 43 is identical in configuration to the VCR 44 and description thereof is omitted herein. The VCR 44 comprises a data recording system 45 and a data reproducing system 46. The data recording system 45 has a picture signal input terminal 26a to which a picture signal is applied externally, a control signal input terminal 26b to which a control signal is applied externally, a coefficient signal input terminal 26c to which a coefficient signal is applied externally and a definition signal input terminal 26p to which a definition signal is applied externally. After being subjected to predetermined picture signal processing in a picture signal processing circuit 26d, an analog picture signal applied to the picture signal input terminal 26a is converted to a digital picture signal by an A/D (analog/digital) converter 26e and then applied to a high-efficiency coding circuit 45f.

A control signal applied to the control signal input terminal 26b is received by a receiving circuit 26g and then applied to the high-efficiency coding circuit 45f. Further, a coefficient signal applied to the coefficient signal input terminal 26c and a definition signal applied to the definition signal input terminal 26p are received by receiving circuits 26h and 26q, respectively, and then applied to the high-efficiency coding circuit 45f. The high-efficiency coding circuit 45f performs a high-efficiency coding process on the input digital picture signal on the basis of the control signal and the coefficient signal for subsequent transmission to a picture signal processing circuit 26i. The picture signal processing circuit 26i performs an error correcting parity adding process and a predetermined interleaving process on the input digital picture signal and then applies it to an adder circuit 26j. The control signal, the coefficient signal and the definition signal, which are output from the high-efficiency coding circuit 26f, are delayed by delay circuits 26k, 26l and 26r, respectively, by a processing time of the picture signal processing circuit 26i and then added to the digital picture signal in the adder circuit 26j. The digital picture signal, which is output from the adder circuit 26j and accompanied by the control signal, the coefficient signal and the definition signal, is subjected to modulation in a modulation circuit 26m, amplified by an recording amplifier 26n and then recorded on magnetic tape 28 by a recording head 26o on a helical scan basis.

On the other hand, the data reproducing system 46 has a reproducing head 27a for tracing the magnetic tape 28 to read the recorded signal. The recorded signal read by the reproducing head 27a is amplified by a reproduce amplifier circuit 27b and then demodulated by a demodulator circuit 27c, whereby the recorded signal is separated into the digital picture signal, the control signal, the coefficient signal and the definition signal. The digital picture signal is applied to a picture signal processing circuit 27d for error correcting and deinterleaving processes and then applied to a decoding circuit 46e. The control signal, the coefficient signal and the definition signal are delayed by delay circuits 27f, 27g and 27o, respectively, by a processing time taken by the picture signal processing circuit 27d to process the digital picture signal and then applied to a decoding circuit 46e, so that the digital picture signal is decoded on the basis of the control signal, the coefficient signal and the definition signal.

The digital picture signal output from the decoding circuit 46e is converted by a D/A (digital/analog) converter circuit 27h to an analog picture signal which is, in turn, subjected to predetermined picture signal processing by a picture signal processing circuit 27i and taken out from a picture signal output terminal 27j. The control signal, the coefficient signal and the definition signal are output from the decoding circuit 46e and then taken out from a control signal terminal 27m, a coefficient signal output terminal 27n and a definition signal output terminal 27q via transmission circuits 27k, 27l and 27p, respectively.

Figure 2:
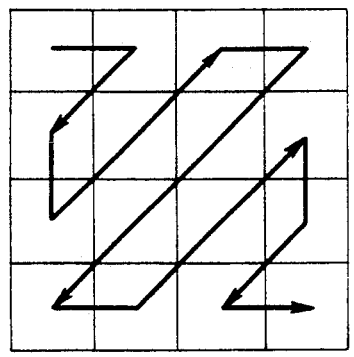
FIG. 2 is a diagram for use in explanation of zig-zag scan in the high-efficiency coding circuit of FIG. 1.

FIG. 13 is a detailed block diagram of the high-efficiency coding circuit 45f. In the figure, corresponding parts to those in FIGS. 8 and 9 are designated by like reference numerals. The frame memory 12 connected between the terminal 11 and the DCT circuit 13 is omitted for simplicity. The color signal system is the same in configuration as the luminance signal system and thus its illustration is omitted. That is, the luminance signal input on a block basis is input to the DCT circuit 13, which performs 8×8 two-dimensional DCT processing and outputs its conversion coefficient to the frame delay circuit 14. The frame delay circuit 14 delays the DCT conversion coefficient by one-frame period and then outputs it to the scan conversion circuit 15. The scan conversion circuit 15 zigzag-scans block data as shown in FIG. 2 on the basis of the contents stored in the standard scan table 16 to rearrange them one-dimensionally so that direct current components and high frequency components are output in sequence in the order of increasing frequency and outputs them to the quantization circuit 17. The quantization circuit 17 quantizes the conversion coefficient on the basis of the basic quantization information in the basic quantization table 39 to reduce the bit rate.

On the other hand, the output of the DCT circuit 13 is also applied to the block activity calculation circuit 22, which obtains block activity YBact indicating the amount of information (definition information) of each block and outputs it to a frame activity calculation Y/C allocation circuit 37. The frame activity Y/C allocation circuit 37 receives the color signal block activity CBact as well and obtains frame activity YFact, CFact of the luminance signal Y and the color signal C and allocated bit quantities YFbit, CFbit of the luminance signal Y and the color signal C which are available in one frame. The frame activity YFbit and the allocated bit quantity YFbit are applied to the coding amount allocation circuit 41. The frame delay circuit 38 delays the block activity YBact for transmission to the coding amount allocation circuit 41.

The coding amount allocation circuit 41 obtains the activity ratio of each block from the frame activity YFact and the block activity YBact to calculate the amount of coding for each block and outputs the allocation amount to a coding amount allocation control circuit 48 of a variable-length coding block 47. The frame activity calculation Y/C allocation circuit 37 outputs a signal S2 indicating the definition (activity) to a comparison select circuit 49 and the average activity Aact of each block to a coefficient a calculation circuit 50. In many cases, the signal S2 is identical to the average activity Aact.

The comparison select circuit 49 is also connected to an input terminal 52 to receive transmission activity S1. The comparison select circuit 49 makes a comparison in magnitude between the activities S1 and S and outputs the result of the comparison to a select signal producing circuit 52, which is also connected to input terminals 33 and 34 to receive a control signal and the switching specification signal (picture-quality deterioration preventing mode). The select signal producing circuit 52 generates such logical outputs as shown in FIG. 14 on the basis of a combination of the result of the magnitude comparison between S1 and S2, the control signal indicating whether or not coding has been performed and the switching specification signal.

The select signal producing circuit 52, which decides a process on the basis of FIG. 14, causes the comparison select circuit 49 to select one of the activities S1 and S2 and outputs a switching signal to the switch circuit 29 and the output terminal 35. The select signal producing circuit 52 further produces a coding amount control signal for controlling on/off of the coding amount allocating operation and outputs it to the coding amount control circuit 48. The comparison select circuit 49 is responsive to the output of the select signal producing circuit 52 to select either of the activities S1 and S2 for transmission to the output terminal 53.

The coefficient signal A1 indicating the transmission coefficient a input via the input terminal 30 is applied to the second fixed contact 29b of the switch circuit 29. The coefficient a calculation circuit 50 calculates the coefficient a from the average activity Aact and applies a coefficient signal A2 to the first fixed contact 29a of the switch circuit 29. The switch circuit 29 is responsive to the switching signal from the select signal producing circuit 52 to output either of the coefficient signals A1 and A2 to the basic quantization table 39 and the output terminal 31. The basic quantization table 39 multiplies basic quantization information stored in the table by the coefficient a and outputs the results of the multiplication to the quantization circuit 17.

Quantized outputs of the quantization circuit 17 are applied to the variable-length coding circuit 40 of the variable-length coding block 47. The variable-length coding circuit 40 has its amount of coding limited by the code allocation control circuit 48 and performs, for example, the huffman coding of an input quantized output for transmission to the output terminal 21. Thereby, a small number of bits are allocated to data which is high in the probability of occurrence and a large number of bits are allocated to data which is low in the probability of occurrence, further reducing the amount of transmission.

As the huffman coding, two-dimensional huffman coding is used which uses the length of successive zeros (hereinafter referred to as zero run) and a non-zero value (hereinafter referred to as a non-zero coefficient) occurring after the zeros. The quantization circuit 17 outputs data of low frequency and high frequency components in sequence in the order of increasing frequency. This series of data are converted to data comprised of the number of zero runs (Zrn), the length of the non-zero coefficient code (Amp) and a non-zero coefficient data code. The non-zero coefficient code length (Amp) indicates how many bits are used to represent the non-zero coefficient and is defined as shown in FIG. 15.

The variable-length coding circuit 40 has a two-dimensional huffman table which is addressed by Zrn and Amp of a quantized output. In the huffman table, codes which are short in bit length are stored in addresses designated by data which are statistically high in the probability of occurrence. By outputting a huffman code stored in an address designated, huffman coding is performed to reduce the bit rate. After the huffman coding of an quantized output, the variable-length coding circuit 40 adds a non-zero coefficient data code to the huffman code. Though the non-zero coefficient data code is variable in length, it can be decoded if the Amp becomes clear. That is, in the huffman coding, Zrn and Amp are combined for statistical assignment of huffman codes and, at the time of decoding, Amp is obtained to decode a non-zero coefficient data code.

Reference is now made to FIG. 16 and FIGS. 17A to 17D to explain the huffman codes. FIG. 16 illustrates quantized outputs of 4×4 blocks. FIGS. 17A to 17D illustrate the data sequence, the zero run and data, the zero run, amp and data, and the huffman codes and non-zero coefficient data codes. A direct current component (128) shown in FIG. 16 is not subjected to the variable-length coding, like an alternating current component. The frequency components are read from the basic quantization table 39 in the order of the zigzag scan as shown in FIG. 17A. In the data sequence, zero runs and non-zero data are combined as shown in FIG. 17B. Using FIG. 15, Amp is produced as shown in FIG. 17C. FIG. 17D illustrate combinations of huffman codes produced and data (non-zero coefficients). In FIG. 17D, H06, H04, . . . each indicate a huffman code.

If Zrn and Amp are found from the huffman code, the huffman code length and the non-zero coefficient data length will be found. The variable-length coding block 47 calculates the huffman code length from Zrn and Amp beforehand, makes sure that the length is less than the bit length allocated to each block, and outputs a huffman code when the bit length is not exceeded, thereby controlling the amount of coding.

FIG. 18 illustrates a specific configuration of the variable-length coding block 47. Quantized outputs input to an input terminal 54 are applied to a zero run detecting circuit 55, an Amp conversion circuit 56 and a delay circuit 57. The zero run detecting circuit 55 obtains the number of zero runs of the quantized outputs and outputs it to the variable-length coding circuit 40 and the Amp conversion circuit 56. The Amp conversion circuit 56 obtains Amp codes from non-zero coefficients of the quantized outputs and outputs them to the variable-length coding circuit 40. The delay circuit 57 outputs the quantized outputs delayed by the processing time of the zero run detecting circuit 55 and the Amp conversion circuit 56 to the variable-length coding circuit 40. The variable-length coding circuit 40 converts each combination of Zrn and Amp to a huffman code which is output to the output terminal 21.

On the other hand, the outputs of the zero run detecting circuit 55 and Amp conversion circuit 56 are also applied to a huffman code length conversion circuit 58, which generates a signal L1 indicating the data length of a huffman code produced by the variable-length coding circuit 40. The signal L1 is applied to an in-block coding amount accumulator 60 via a switch 59 and to a length comparison circuit 61. The length comparison circuit 61 is, as will be described later, connected to receive the allowable code length L2 indicating the number of bits remaining to be used and makes a comparison between L1 and L2. As a result of the comparison, the circuit outputs a huffman coding instructing signal h to the variable-length coding circuit 40 and the control terminal of the switch 59. That is, when L1<L2, the length comparison circuit 61 outputs the huffman coding instructing signal h to cause the variable-length coding circuit 40 to perform coding and output a huffman code to the output terminal 21. On the other hand, the switch 59 applies the bit length signal L1 to the in-block coding amount accumulator 60 as its input signal Ln upon receipt of the huffman coding instructing signal h at its control terminal. The in-block coding amount accumulator 60 accumulates the data length signal L1 until it is reset by a block reset signal and obtains an amount of coding LB used in a predetermined block, LB being output to an allowable (remaining) code length calculating circuit 62.

An input terminal 63 is supplied with an allocation coding amount LS from the coding amount allocation circuit 41 (refer to FIG. 13), while an input terminal 64 is supplied with a coding amount (carry-over code length) Lk' which was not used in the last block. The allowable (remaining) code length calculation circuit 62 calculates $L=LS+Lk'-LB$ and outputs it to a terminal 65b of a switch circuit 65.

A terminal 65a of the switch circuit 65 is supplied with a set length L' when the allocation of coding amount is not performed. If maximum fixed data is set as the set length L', the variable-length coding will be performed irrespective of allocation. A bit length setting circuit 66 produces a predetermined set length L' according to input bit-length data. The switch circuit 65 is responsive to the coding amount control signal from the select signal producing circuit 52 (refer to FIG. 13) to output either of L' and L applied to the terminals 65a and 65b to the allowable code length setting circuit 68.

The allowable code length setting circuit 68 holds the output of the switch circuit 65 and outputs it to the length comparison circuit 61 as the allowable code length L2. The allowable code length setting circuit 68 is also supplied with the huffman coding instructing signal h. When the signal h indicates L1>L2, the amount of coding L2 which was not used for coding is output to the output terminal 69 as a carry-over coding amount LK. The carry-over coding amount LK is used at the time of the coding of the next block. The carry-over code length Lk' from the input terminal 64 may be Lk of one block before from the output terminal 69 or the carry-over coding amount from the color signal system. The allowable code length setting circuit 68 is responsive to a block reset signal to output the carry-over coding amount Lk as the remaining coding amount.

The in-block coding amount accumulator 60 is responsive to a block reset signal generated for each block to output the result of accumulation to an in-frame coding amount accumulator 70 and then is reset. The in-frame coding amount accumulator 70 accumulates the amount of coding used in each block in a frame, outputs an accumulated value to the output terminal 71 at the timing of a frame reset signal and then is reset.

In the variable-length coding block 47 configured as above, the length of a huffman code is obtained by the huffman code length conversion circuit 58. The code length is applied to the in-block coding amount accumulator 60 via the switch at the time of outputting of variable-length data by the huffman coding instructing signal h. The in-block coding amount accumulator 60 is reset by the block reset signal to output the amount of coding Lb accumulated from the beginning of a block to the allowable (remaining) code length calculating circuit 62. The allowable (remaining) code length calculating circuit 62 is supplied with the allocated coding amount LS and the carry-over code length Lk' via the input terminals 63 and 64 and outputs the remaining available bit length in a block being converted to the switch circuit 65. The switch circuit 65, supplied with the coding amount control signal based on FIG. 14, outputs the bit length L to the allowable code length setting circuit 68 when the allocation of coding amount is performed or the set length L' when the coding amount allocation is not performed.

The allowable code length setting circuit 68 holds the output of the switch circuit 65 to apply the allowable code length L2 to the length comparison circuit 61. When the allowable code length L2 is larger than the huffman code length L1, the comparison circuit 61 outputs a huffman coding instructing signal h to cause the variable-length coding circuit 40 to perform huffman coding. When the allowable code length L2 is smaller than the huffman code length L1, the comparison circuit 61 causes the variable-length coding circuit 40 to stop the huffman coding. Thereby, the allowable code length setting circuit 68 outputs the allowable code length L2 from the output terminal 69 as a carry-over coding amount LK to be used in the next block.

Next, the operation will be described. In FIG. 13, the block activity YBact of the luminance signal Y and the block activity CBact of the color signal C obtained by the block activity calculation circuit 22 are applied to the frame activity calculation Y/C allocation circuit 37. The circuit 37 performs code allocation for each of the luminance and color systems and then outputs the allocated bit amount YFbit and the frame activity YFact to the coding amount allocation circuit 41. The coding amount allocation circuit 41 is also supplied with the block activity YBact via the frame delay circuit 38 and calculates the amount of coding according to the activity ratio of each block to thereby output the allocated coding amount to the coding amount allocation control circuit 48.

On the other hand, the definition (activity) signal S2 obtained by the frame activity calculation Y/C allocation circuit 37 is applied to the comparison select circuit 49. The select circuit 49, controlled by the select signal producing circuit 52, outputs either of the activity S2 and the definition signal S1 to the output terminal 53 and the select signal producing circuit 52. The select signal producing circuit 52 is responsive to a combination of the result of comparison by the comparison select circuit 49, the control signal indicating whether or not the coding has been performed and the switching specifying signal to generate the logical outputs shown in FIG. 14.

As shown in FIG. 14, when the deterioration of picture quality is not prevented, the coding amount control signal is output to the coding amount allocation control circuit 48. The coding amount control signal is applied to the switch circuit 65 of FIG. 18 to select the output L of the allowable (remaining) code length calculation circuit 62. In this case, the same operation as in the embodiment of FIG. 8 is performed, so that the coding amount allocation and the huffman coding are performed. As shown in FIG. 14, either of the coefficients A1 and A2 may be used in coding image data which has been coded and decoded again, but the use of the coefficient A1 can make the deterioration of picture quality less. The comparison select circuit 49 may select the activity Ss obtained by calculation or the activity S1 when S>S2.

On the other hand, if the deterioration of picture quality is prevented, when image data has already been coded and decoded, the switch circuit 29 of FIG. 13 is controlled to apply the transmitted coefficient A1 to the basic quantization table 39. Further, in this embodiment, of the activities S1 and S2 a larger one is output from the comparison select circuit 49 and, when the transmitted activity S1 is larger than the calculated activity S2, a coding amount control signal for stopping the coding amount allocating operation is output. In this case, the switch circuit 65 applies the set length L' to the allowable code length setting circuit 68. Thereby, the coding amount of a block is limited to a predetermined bit length and the coding amount allocation is not performed. In this case as well, since the bit length has already been limited at the time of the previous coding, the number of bits required for this coding will never become insufficient.

In a case where the activity S2 becomes larger than the activity S1 because of noise during transmission, stopping of the coding amount allocating operation causes a fear that the upper-limit coding amount will be exceeded. Thus, the allocating operation is not stopped. In this case, the coding amount allocation is performed on the basis of an input picture signal for a constant rate version. The allocating operation is not stopped only if S2 is greater than S1 by $10^{-3}$ to $10^{-4}$%. The operation is stopped if S2 has a threshold Th (several percent of S1) and if $S2 > S1 + Th$.

In the embodiment of FIG. 11, as described above, when the activity S1 at the time of the last coding is equal to or larger than the calculated activity S2, the coding amount allocating operation is stopped, thereby preventing data that cannot be coded from being generated and suppressing the deterioration of picture quality.

FIG. 19 illustrates a third embodiment of the present invention. VCRs 72 and 73 have substantially the same configuration as the VCRs 43 and 44 shown in FIG. 11. The VCRs 72 and 73 each have a high-efficiency coding and decoding function. The VCR 72 outputs to the VCR 73 a reproduced picture signal as an effective transmission information signal, a control signal indicating whether or not the reproduced picture signal has been subjected to the high-efficiency coding and decoding process in the past, and a coefficient signal indicating a coefficient A1 or a definition signal indicating the definition (activity) S1 of the picture signal when the picture signal has been subjected to the high-efficiency coding and decoding process.

Figure 20:
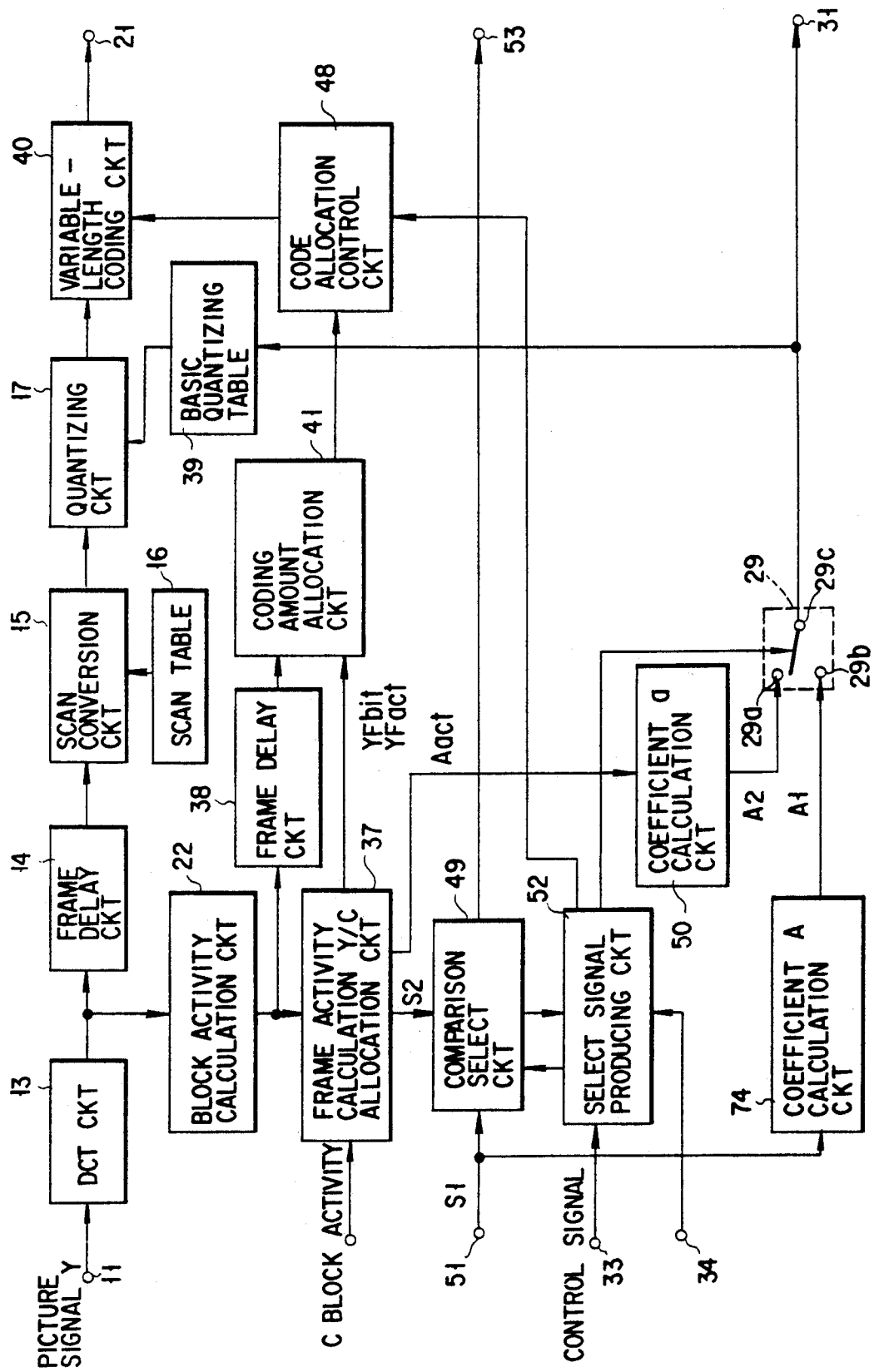
FIG. 20 is a block diagram of means of producing a coefficient A1 from transmission activity S1 in the third embodiment.

FIG. 20 illustrates a specific configuration of a high-efficiency coding circuit used in the third embodiment. In the figure, corresponding parts to those in FIG. 13 are designated by like reference numerals. The third embodiment is distinct from the embodiment shown in FIG. 11 in that the transmission activity S1 is applied from the input terminal 51 to a coefficient a calculation circuit 74 to calculate the coefficient A1 and the coefficient is applied to the second fixed terminal 29b of the switch circuit 29. That is, in the embodiment shown in FIG. 11, both of the transmission activity S1 and the transmission coefficient A1 are transmitted, while, in FIG. 20, the coefficient A1 is not transmitted and the transmission activity S1 is applied to the coefficient a calculation circuit 74 to thereby obtain the coefficient A1 by calculation. The embodiment of FIG. 20 may be configured in such a way as to apply the transmission activity S1 and the average activity Aact to the coefficient a calculation circuit 50 and operate the calculation circuit 50 on a time division basis, thereby obtaining the coefficients A1 and A2.

The operation of the high-efficiency coding circuit shown in FIG. 20 will be described. The transmission coefficient S1 is input to the input terminal 51. The transmission coefficient S1 is applied to the coefficient a calculation circuit 74 to calculate the transmission coefficient A1. The calculated transmission coefficient A1 is applied to the second fixed contact 29b of the switch circuit 29. As described in connection with FIG. 13, the switch circuit 29 is controlled by the select signal producing circuit 52 to select either of the first and second fixed contacts 29a and 29b.

Figure 21:
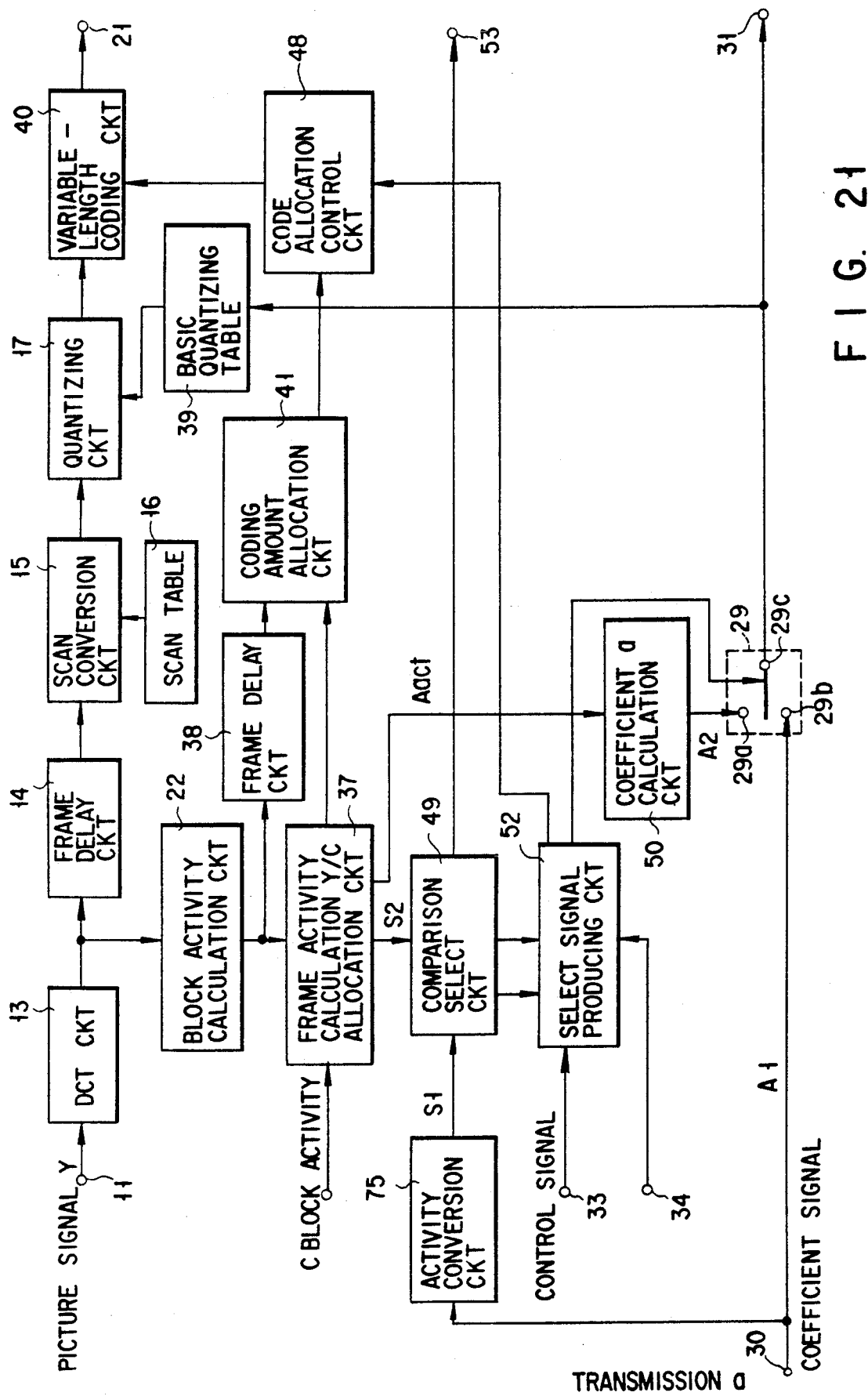
FIG. 21 is a block diagram of means of producing activity S1 from a transmission coefficient A1 in the third embodiment.

FIG. 20 may be modified as shown in FIG. 21. In FIG. 21, corresponding parts to those in FIG. 13 are designated by like reference numerals. FIG. 21 is distinct in configuration from FIG. 20 in that the transmission coefficient A1 input to the input terminal 30 is applied to an activity conversion circuit 75 to calculate the activity S1 and the activity S1 is applied to the comparison select circuit 49. That is, in FIG. 21, the coefficient A1 is transmitted, while the activity S1 is not transmitted. The activity S1 is calculated from the transmission coefficient A1 by the activity conversion circuit 75 and then applied to the comparison select circuit 49. The comparison select circuit 49 makes a comparison between the input activities S1 and S2 and outputs either of S1 and S2. Other operations are the same as those in FIG. 13. The third embodiment transmits one of the transmission coefficient S1 and the transmission coefficient A1 and obtains the other by calculation, thus reducing the amount of transmit information.

FIG. 22 illustrates a fourth embodiment of the present invention. Corresponding parts to those in FIG. 13 are designated by like reference numerals. To the quantization circuit 17 are selectively connected a half-adjust (counting fractions of 5 and over as a unit and disregarding the rest) circuit 77 and a truncation circuit 78 by a switch circuit 76 which is controlled by an output of the select signal producing circuit 52. When connected to the quantization circuit 17, the half-adjust circuit 77 operates to half-adjust the quantizing operation of the quantization circuit 17, while the truncation circuit 78 operates to truncate the quantizing operation of the quantization circuit. The switch circuit 76 is changed over by an output of the select signal producing circuit 52 and selects the truncation circuit 78 when the picture quality deterioration preventing mode (set by a switching specifying signal applied to the input terminal 34) is specified.

Here, the truncation and the half-adjust of the quantizing operation will be described. In the quantizing process described in connection with FIG. 3A to 3D, the truncation is used. In the quantizing process, the half-adjust may be used. When the half-adjust is used, the amount of coding may be increased more than that of the last quantized output by the quantizing process. In the fourth embodiment, therefore, the truncation circuit 78 is selected by the switch circuit 76 when the picture quality deterioration preventing mode is specified, the transmission activity S1 and the transmission coefficient A1 are used and the coding amount control is stopped. Thereby, the quantization circuit 17 operates in the truncation mode, so that the amount of coding at the last coding time is maintained. In the fourth embodiment, therefore, a situation in which data conversion is made impossible in the coding circuit 40 because of increase in the amount of coding can be avoided by operating the quantization circuit 17 to perform the truncating process in the picture quality deterioration preventing mode.

Figure 23:
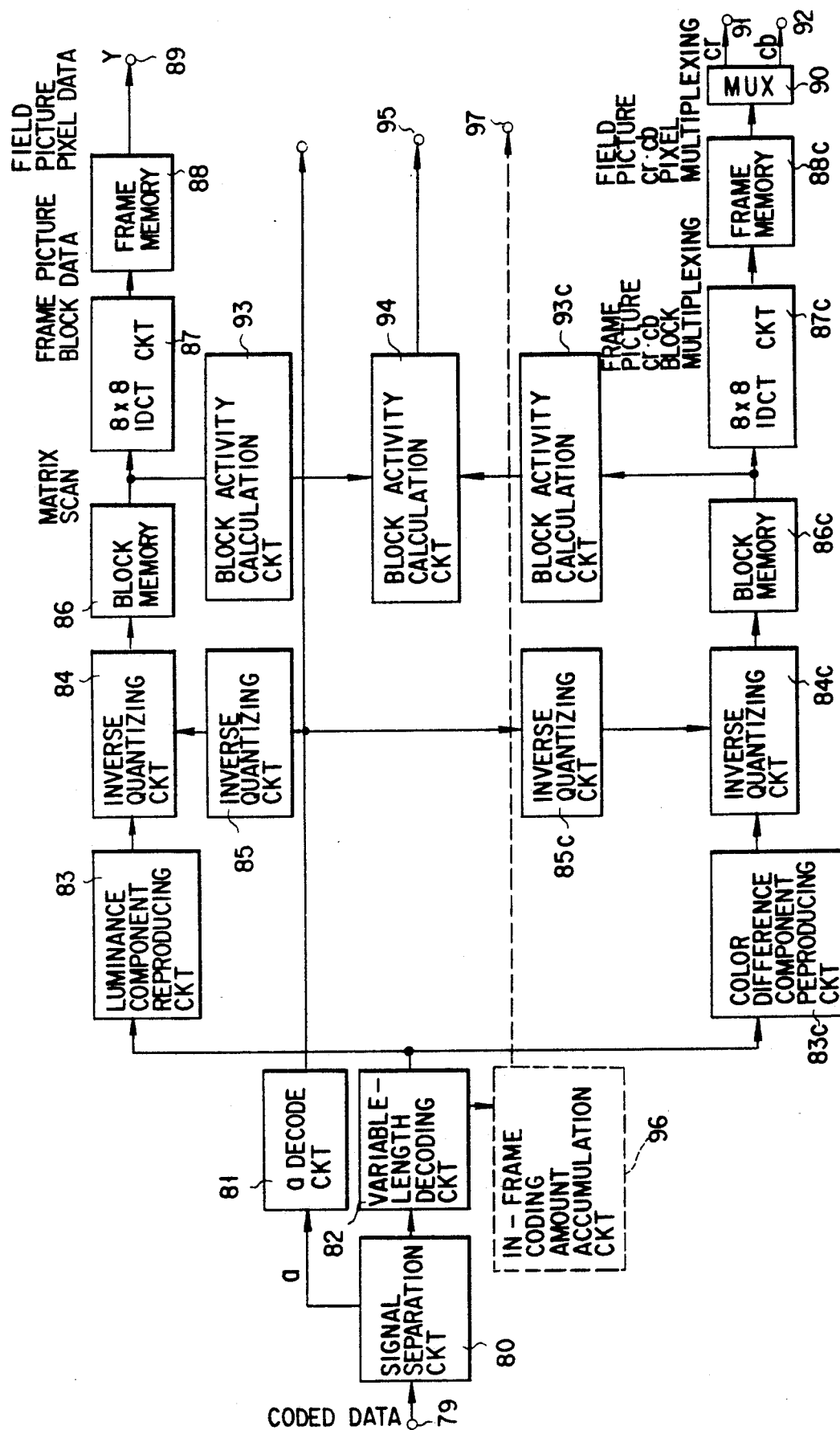
FIG. 23 is a block diagram of a fifth embodiment of the present invention.

FIG. 23 illustrates a fifth embodiment of the present invention. That is, coded data recorded on magnetic tape 28 is applied to a signal separation circuit 80 via an input terminal 79 after being subjected to processes, such as synchronizing, demodulating, time-base correcting (TBC), etc., at the time of reproduction. The signal separation circuit 80 separates an input signal into a coefficient a and variable-length codes, which are, in turn, output to an a decode circuit 81 and a variable-length code decode circuit 82, respectively. The variable-length code decode circuit 82 separates input data into zero runs and Amp and takes out a non-zero coefficient data code corresponding to each huffman code to decode non-zero coefficients to original data. Of decoded fixed-length data, a luminance signal component is output to a luminance signal reproducing circuit 83, while a color signal is output to a color difference signal reproducing circuit 83c.

The luminance signal reproducing circuit 83 converts luminance data to frequency signals and arranges them in sequence in the order of increasing frequency as in the case of recording. The arranged frequency signals are output to an inverse quantization circuit 84. The color difference signal reproducing circuit 83c returns the color difference data to frequency signals and arranges them in sequence in the order of increasing frequency for subsequent transmission to an inverse quantization circuit 84c. On the other hand, the coefficient a decode circuit 81 decodes the coefficient a from the signal separation circuit 80 and outputs it to inverse quantization tables 85 and 85c. The inverse quantization tables 85 and 85c multiply their stored basic quantization data by the coefficient a and output them to the inverse quantization circuits 84 and 84c.

The inverse quantization circuit 84 performs inverse quantization on data, corresponding to the quantization table at the time of recording, from the inverse quantization table 85 and recovers DCT coefficient data. The DCT coefficient data is applied to an IDCT circuit 87 via a block memory 86. The IDCT circuit 87 performs inverse DCT conversion of input data to return it to the original frequency axis and outputs it to the frame memory 88. The frame memory 88 converts decoded block data to field data and outputs the field data to an output terminal 89.

The inverse quantization circuit 84c, the block memory 86c, the IDCT circuit 87c and the frame memory 88c in the color system are the same in configuration as the inverse quantization circuit 84, the block memory 86, the IDCT circuit 87 and the frame memory 88 in the luminance system, respectively. However, the output of the frame memory 88c is connected to a multiplexer 90. The multiplexer 90 separates time-division multiplexed color difference signals Cr and Cb and outputs them to output terminals 91 and 92.

The outputs of the block memories 86 and 86c are connected to block activity calculation circuits 93 and 93c for calculating block activities of luminance and color signals which are applied to a frame activity calculation circuit 94. The frame activity calculation circuit 94 calculates a frame activity (definition signal) which is output from an output terminal 95. An in-frame coding amount accumulation circuit 96 obtains the amount of coding used in a frame from a reproduced signal and outputs it to an output terminal 97.

In the embodiment of FIG. 13, the block activity calculation circuit 22 calculates a block activity from the output of the DCT circuit 13 in the recording system and the frame activity calculation Y/C allocation circuit 37 calculates a frame activity. However, the actual amount of coding is not made clear until the coding is terminated. In the fifth embodiment, therefore, a frame activity is calculated from an output after the inverse quantizing process at the time of reproducing.

That is, data decoded by the variable-length decode circuit 82 is applied to the luminance signal reproducing circuits 83 and 83c. The outputs of the luminance signal reproducing circuits 83 and 83c are subjected to the inverse quantizing process by the inverse quantization circuits 84 and 84c and then applied to the block activity calculation circuits 93 and 93c via the block memories 86 and 86c. Thereby, the block activity calculation circuits 93 and 93c can obtain block activities of image data being transmitted. The frame activity calculation circuit 94 obtains a frame activity from the block activities of the input luminance and color difference signals.

As described above, the fifth embodiment, in which the frame activity calculation circuit 94 calculates a frame activity from a reproduced signal, permits an accurate frame activity (definition signal) to be transmitted. In addition, there is no need of recording the definition signal on recording medium.

Figure 24:
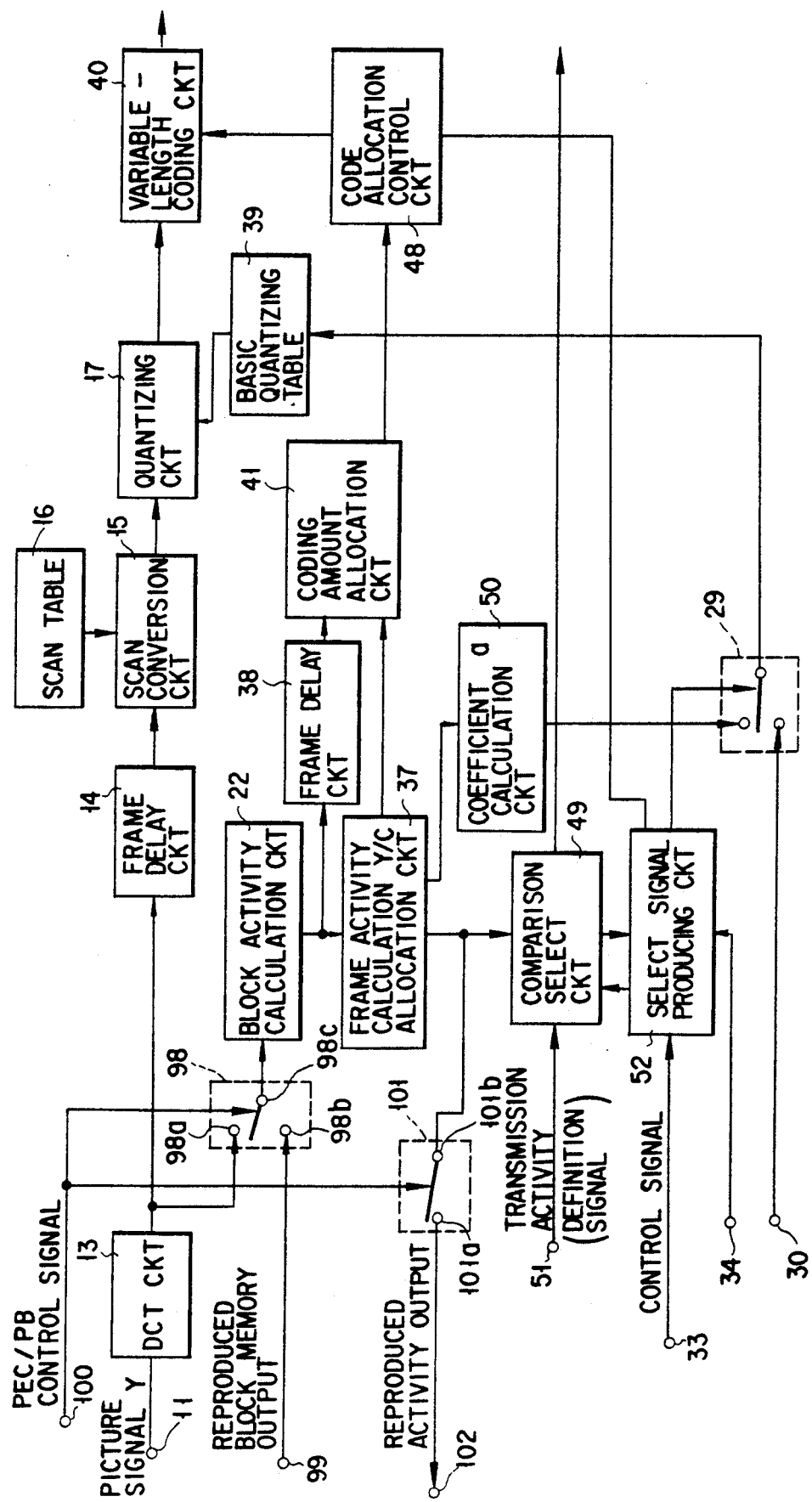
FIG. 24 is a block diagram of a sixth embodiment of the present invention.

FIG. 24 illustrates a sixth embodiment of the present invention. In the figure, corresponding parts to those in FIG. 13 are designated by like reference numerals. In the sixth embodiment, the activity calculation in the fifth embodiment shown in FIG. 23 is performed by circuits on the recording side. That is, the output of the DCT circuit 13 is connected to a terminal 98a of a switch circuit 98 and the output of the block memory 86 of FIG. 23 is connected to a terminal 98b of the switch circuit 98. The switch circuit 98 is changed over by an REC/PB control signal input from an input terminal 100. That is, the switch circuit 98 selects the output of the DCT 13 at the time of recording (REC) and the output of the block memory 86 at the time of playback (PB).

The REC/PB control signal is also applied to a switch 101, which is turned on at the time of playback to thereby output an activity output of the frame activity calculation Y/C allocation circuit 37 to an output terminal 102. The switch 101 is in the off state at the time of recording.

The operation of the sixth embodiment will be described. First, at the time of recording, the REC/PB control signal input from the input terminal 100 causes the switch circuit 98 to select the terminal 98a, whereby the output of the DCT circuit 13 is connected to the block activity calculation circuit 22. In this case, the switch 101 is off, so that the same connection as in FIG. 13 is obtained and like operation is performed. At the time of playback, on the other hand, the REC/PB control signal causes the switch circuit 98 to select the terminal 98b and turn the switch 101 on. Thereby, the output of the block memory 86 is connected to the block activity calculation circuit 22 and a block activity obtained by the block activity calculation circuit 22 is applied to the frame activity calculation Y/C allocation circuit 37, so that a frame activity is obtained. The frame activity is output to the output terminal 102 via the switch 101 for transmission.

In the sixth embodiment, as described above, the block activity calculation circuit 22 and the frame activity calculation Y/C allocation circuit 37 are both used at the times of recording and playback, thereby reducing the circuit scale.

FIG. 25 illustrates a seventh embodiment of the present invention. VCRs 103 and 104 each have a high-efficiency coding and decoding function. To the VCR 104 the VCR 103 outputs a reproduced picture signal as an effective transmit information signal, a control signal indicating whether or not the picture signal has been subjected to a high-efficiency coding and decoding process in the past, a definition signal indicating the definition (activity) S1 of the picture signal when it has been subjected to the high-efficiency coding and decoding process in the past and a coding amount signal indicating the amount of coding.

Figure 26:
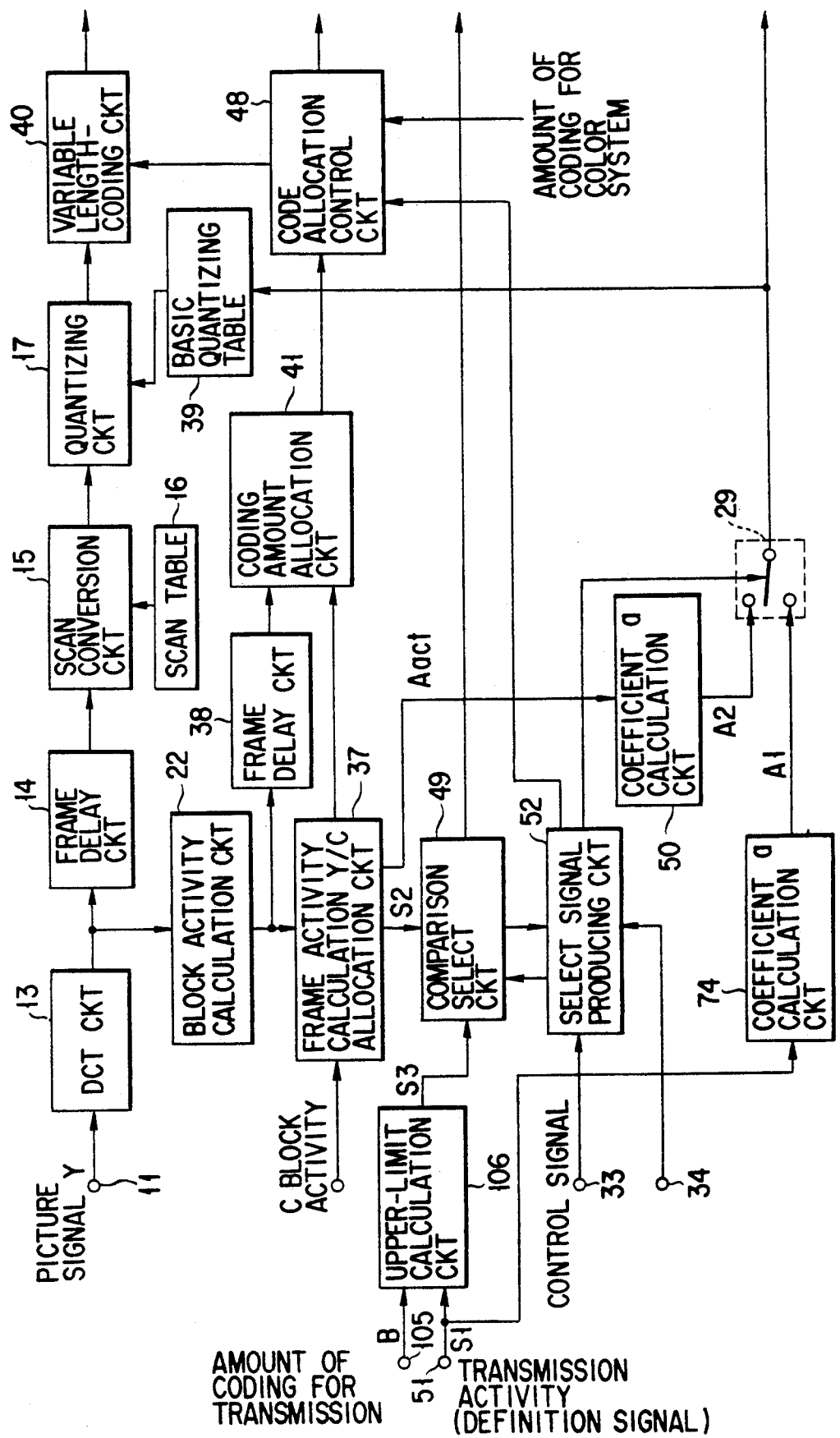
FIG. 26 is a detailed block diagram of the high-efficiency coding circuit of the seventh embodiment of the present invention.

FIG. 26 illustrates a specific configuration of a high-efficiency coding and decoding circuit used in the seventh embodiment. In the figure, corresponding parts to those in FIG. 20 are designated by like reference numerals. That is, a transmission coding amount B is applied to an upper-limit activity calculation circuit 106 via an input terminal 105. The upper-limit activity calculation circuit 106 is also supplied with a transmission activity S1 via the input terminal 51 and calculates an upper-limit activity (definition) S3 by the equation given by $$S3 \leq S1 \times C/B \text{ (C is a desired rate)}$$

The upper-limit activity S3 obtained by the upper-limit activity calculation circuit 106 is applied to the comparison select circuit 49, which is responsive to the select signal producing circuit 52 to selectively output either of the activities S2 and S3.

As shown-previously in FIG. 10, the number of bits actuated used is small for coding amount allocation obtained on the basis of the activity. In the seventh embodiment, therefore, by transmitting a coding amount signal, the activity is allowed to be output up to the upper limit of the bit rate. That is, the upper-limit activity calculation circuit 106 obtains the upper-limit activity S3 by the calculation indicated by the above equation. The comparison select circuit 49 makes a comparison between the activities S2 and S3. In this case, the select circuit 49 outputs either of the activities on the basis of the logical result using S3 in place of S1 in FIG. 14.

In the seventh embodiment, as described above, the upper-limit activity S3 based on the transmission activity S1 and the transmission coding amount B is obtained by the upper-limit activity calculation circuit 106, thereby increasing noise margin. As the transmission coding amount, the remaining amount (C−B) may be transmitted in place of accumulated data B.

Although the preferred embodiments of the present invention have been disclosed and described, it is apparent that other embodiments and modifications are possible.

What is claimed is:

1. A recording/reproducing apparatus for recording a coded signal obtained by performing a high-efficiency coding process on an information signal on a recording medium and reproducing the original information signal by performing a decoding process corresponding to the high-efficiency coding process on the coded signal read from the recording medium, comprising:

input lines respectively connected to receive the information signal, a control signal indicating whether or not the information signal has been subjected to the high-efficiency coding and decoding processes and a specific signal indicating a specific value used in the high-efficiency coding and decoding processes when the information signal has been subjected to the high-efficiency coding and decoding processes;

coding means for performing a high-efficiency coding process on the input information signal using the specific value on the input information signal when the control signal indicates that the input information signal has not been subjected to the high-efficiency coding and decoding processes, producing a coefficient signal indicating the specific value and a control signal indicating the information signal has been subjected to the high-efficiency coding and decoding processes and performing a high-efficiency coding process on the input information signal on the basis of the specific value indicated by the input specific signal when the input control signal indicates that the input information signal has been subjected to the high-efficiency coding and decoding processes;

recording means for recording the information signal subjected to the high-efficiency coding process by said coding means on the recording medium together with the control signal and the specific signal produced by said coding means or input to said input lines;

reproducing means for reading the coded signal, the control signal and the specific signal from the recording medium; and decoding means for performing a decoding process on the coded signal read by said reproducing means on the basis of the specific value indicated by the read specific signal and outputting the information signal subjected to the decoding process together with the read control and specific signals.

2. The recording/reproducing apparatus according to claim 1, in which the specific value of the specific signal is a coefficient used in the high-efficiency coding process; and said coding means comprises orthogonal transformation means for transforming the information signal from on the time axis to on the frequency axis for each of predetermined blocks, scan conversion means for rearranging outputs of said orthogonal transformation means so that a direct current component and high frequency components are transmitted in sequence in the order of increasing frequency, quantizing means for performing a quantizing process on outputs of said scan conversion means by calculations using the contents of a table set on the basis of the coefficient, variable-length coding means for variable-length coding outputs of said quantizing means to produce the coded signal, activity means for calculated definition of the information signal for instance, from outputs of said orthogonal transformation means, coefficient converting means for converting the activity calculated by said definition calculating means to the coefficient, and selecting means for using the coefficient output from said coefficient converting means for the quantizing process by said quantizing means when the control signal input to the line indicates that the input information signal has not been subjected to the high-frequency coding and decoding processes and using the coefficient indicated by the specific signal applied to the line for the quantizing process by said quantizing means when the control signal input to the line indicates that the input information signal has been subjected to the high-frequency coding and decoding processes.

3. The recording/reproducing apparatus according to claim 1, in which the specific value of the specific signal indicates a coefficient used in the high-efficiency coding process and a definition value of the information signal, and said coding means performs a quantizing process on the input information signal using a coefficient and a definition value produced on the basis of the input information signal and codes the information signal by performing bit allocation on the information signal for each of blocks when the input control signal indicates that the input information signal has not been subjected to the high efficiency coding and decoding processes, makes a comparison between the definition produced on the basis of the information signal and the definition indicated by the input specific signal to decide the presence or absence of an increase in information amount when the input control signal indicates that the input information signal has been subjected to the high-efficiency coding and decoding processes, quantizes the information signal on the basis of the coefficient and definition indicated by the input specific signal and codes the information signal without performing the bit allocation when there is no increase in information amount, and quantizes the information signal using a coefficient and definition produced on the basis of the input information signal and codes the information signal by performing bit allocation on the information signal for each of blocks.

4. The recording/reproducing apparatus according to claim 3, in which said coding means comprises orthogonal transformation means for transforming the information signal from on the time axis to on the frequency axis for each of predetermined blocks, scan conversion means for rearranging outputs of said orthogonal transformation means such that a direct current component and high frequency components are transmitted in sequence in the order of increasing frequency, quantizing means for performing a quantizing process on outputs of said scan conversion means by calculations using the contents of a table set on the basis of the coefficient, variable-length coding means for variable-length coding outputs of said quantizing means to produce the coded signal, activity means for calculating the definition of the information signal from outputs of said orthogonal transformation means, coefficient converting means for converting the activity calculated by said definition calculating means to the coefficient, selecting means for permitting said quantizing means to use the coefficient output from said coefficient converting means for its quantizing process when the control signal input to the line indicates that the input information signal has not been subjected to the high-frequency coding and decoding processes and permitting said quantizing means to use the coefficient indicated by the specific signal applied to the line for its quantizing process when the control signal input to the line indicates that the input information signal has been subjected to the high-frequency coding and decoding processes, and comparing means for making a comparison between the definition calculated by the definition calculating means and the definition indicated by the input specific signal to decide the presence or absence of an increase in information amount, thereby permitting said variable-length coding means to perform a coding process without performing the bit allocation when there is no increase in information amount and to perform a coding process based on the bit allocation when there is an increase in information amount.

5. The recording/reproducing apparatus according to claim 1, in which the specific value of the specific signal indicates a coefficient used in the high-efficiency coding process, and said coding means performs a quantizing process on the input information signal using a coefficient and a definition value produced on the basis of the input information signal and codes the information signal by performing bit allocation on the information signal for each of blocks when the input control signal indicates that the input information signal has not been subjected to the high-efficiency coding and decoding processes, makes a comparison between the definition produced on the basis of the information signal and the definition indicated by the input specific signal to decide the presence or absence of an increase in information amount when the input control signal indicates that the input information signal has been subjected to the high-efficiency coding and decoding processes, quantizes the information signal on the basis of the coefficient indicated by the input specific signal and the definition calculated from the coefficient and codes the information signal without performing the bit allocation when there is no increase in information amount, and quantizes the information signal using a coefficient and definition produced on the basis of the input information signal and codes the information signal by performing the bit allocation on the information signal for each of blocks.

6. The recording/reproducing apparatus according to claim 5, in which said coding means comprises orthogonal transformation means for transforming the information signal from on the time axis to on the frequency axis for each of predetermined blocks, scan conversion means for rearranging outputs of said orthogonal transformation means such that a direct current component and high frequency components are transmitted in sequence in the order of increasing frequency, quantizing means for performing a quantizing process on outputs of said scan conversion means by calculations using the contents of a table set on the basis of the coefficient, variable-length coding means for variable-length coding outputs of said quantizing means to produce the coded signal, definition calculating means for calculating the definition of the information signal from outputs of said orthogonal transformation means, coefficient converting means for converting the definition calculated by said definition calculating means to the coefficient, selecting means for permitting said quantizing means to use the coefficient output from said coefficient converting means for its quantizing process when the control signal input to the line indicates that the input information signal has not been subjected to the high-frequency coding and decoding processes and permitting said quantizing means to use the coefficient indicated by the specific signal applied to the line for its quantizing process when the control signal input to the line indicates that the input information signal has been subjected to the high-frequency coding and decoding processes, calculating means for calculating definition from the coefficient indicated by the input specific signal, and comparing means for making a comparison between the definition calculated by the definition calculating means and the definition indicated by the input specific signal to decide the presence or absence of an increase in information amount when the input control signal indicates that the input information signal has been subjected to the high-frequency coding and decoding processes, thereby permitting said variable-length coding means to perform a coding process without performing the bit allocation when there is no increase in information amount and to perform a coding process based on the bit allocation when there is an increase in information amount.

7. The recording/reproducing apparatus according to claim 1, in which the specific value of the specific signal indicates the definition of the information signal, and said coding means performs a quantizing process on the input information signal using a coefficient and a definition value produced on the basis of the input information signal and codes the information signal by performing bit allocation on the information signal for each of blocks when the input control signal indicates that the input information signal has not been subjected to the high-efficiency coding and decoding processes, makes a comparison between the definition produced on the basis of the information signal and the definition indicated by the input specific signal to decide the presence or absence of an increase in information amount when the input control signal indicates that the input information signal has been subjected to the high-efficiency coding and decoding processes, quantizes the information signal on the basis of the coefficient indicated by the input specific signal and the definition calculated from the coefficient and codes the information signal without performing the bit allocation when there is no increase in information amount, and quantizes the information signal using a coefficient and definition produced on the basis of the input information signal and codes the information signal by performing the bit allocation on the information signal for each of blocks.

8. The recording/reproducing apparatus according to claim 7, in which said coding means comprises orthogonal transformation means for transforming the information signal from on the time axis to on the frequency axis for each of predetermined blocks, scan conversion means for rearranging outputs of said orthogonal transformation means such that a direct current component and high frequency components are transmitted in sequence in the order of increasing frequency, quantizing means for performing a quantizing process on outputs of said scan conversion means by calculations using the contents of a table set on the basis of the coefficient, variable-length coding means for variable-length coding outputs of said quantizing means to produce the coded signal, definition calculating means for calculating the definition of the information signal from outputs of said orthogonal transformation means, coefficient converting means for converting the definition calculated by said definition calculating means to the coefficient, calculating means for calculating a coefficient from the definition indicated by the input specific signal, selecting means for permitting said quantizing means to use the coefficient output from said coefficient converting means for its quantizing process when the control signal input to the line indicates that the input information signal has not been subjected to the high-frequency coding and decoding processes and permitting said quantizing means to use the coefficient indicated by the specific signal applied to the line for its quantizing process when the control signal input to the line indicates that the input information signal has been subjected to the high-frequency coding and decoding processes, and comparing means for making a comparison between the definition calculated by the definition calculating means and the definition indicated by the input specific signal to decide the presence or absence of an increase in information amount when the input control signal indicates that the input information signal has been subjected to the high-frequency coding and decoding processes, thereby permitting said variable-length coding means to perform a coding process without performing the bit allocation when there is no increase in information amount and to perform a coding process based on the bit allocation when there is an increase in information amount.

9. The recording/reproducing apparatus according to claim 1, in which said coding means is externally switched between truncate processing and half-adjust processing in processing of low-order digits in its quantizing process.

10. The recording/reproducing apparatus according to claim 1, in which the specific value of the specific signal indicates the definition of information signal, and said decoding means produces definition as a specific value to be output externally on the basis of the coded signal read from by said reproducing means.

11. The recording/reproducing apparatus according to claim 1, in which the specific value of the specific signal indicates the definition of the information signal and the amount of coding for high-efficiency coding, and said coding means performs a quantizing process on the input information signal using a coefficient and a definition value produced on the basis of the input information signal and codes the information signal by performing bit allocation on the information signal for each of blocks when the input control signal indicates that the input information signal has not been subjected to the high-efficiency coding and decoding processes, makes a comparison between definition produced on the basis of the information signal and upper-limit definition calculated from the amount of coding indicated by the input specific signal and controls the amount of coding for the high-efficiency coding process according to the result of the comparison when the input control signal indicates that the input information signal has been subjected to high-efficiency coding and decoding processes.

12. The recording/reproducing apparatus according to claim 4 or 8, further comprising means for selectively applying the output of said orthogonal transformation means and the output of said decoding means to said definition calculating means depending on recording and reproducing operations of said recording/reproducing apparatus, and said definition calculating means is used at the times of recording and reproducing of the information signal.

* * * * *